United States Patent

Miyazaki

[11] Patent Number: 6,144,201
[45] Date of Patent: Nov. 7, 2000

[54] MR IMAGING UTILIZING ECG GATING TECHNIQUE

[75] Inventor: Mitsue Miyazaki, Otawara, Japan

[73] Assignee: Kabushiki Kaisha Toshiba, Kanagawa-Ken, Japan

[21] Appl. No.: 09/146,050

[22] Filed: Sep. 2, 1998

[30] Foreign Application Priority Data

Dec. 26, 1997 [JP] Japan .................................. 9-360999

[51] Int. Cl.$^7$ ...................................................... G01V 3/00
[52] U.S. Cl. ........................... 324/306; 324/309; 600/413
[58] Field of Search .................................... 324/306, 300; 600/413

[56] References Cited

U.S. PATENT DOCUMENTS

| 5,251,628 | 10/1993 | Foo ........................................ 128/653.3 |
| 5,692,508 | 12/1997 | Simonetti et al. ...................... 324/309 |
| 5,987,348 | 11/1999 | Fischer et al. .......................... 600/413 |

FOREIGN PATENT DOCUMENTS 0 599 456 A1  1/1994  European Pat. Off. ........ G01R 33/56

OTHER PUBLICATIONS

Constable et al, "The Loss of Small Objects in Variable TE Imaging: Implications for FSE, RARE< and EPI", Magnetic Resonance in Medicine 28, 9–24 (1992).

*Primary Examiner*—Christine K. Oda
*Assistant Examiner*—Brij B. Shrivastav
*Attorney, Agent, or Firm*—Nixon & Vanderhye P.C.

[57] ABSTRACT

In order to perform an ECG-gating imaging MR scan with an exact ECG-gating time predetermined, in an MRI system and MR imaging method, an ECG signal of a patient is acquired. A preparing MR scan with a region containing an object to be imaged of the patient starts at each of a plurality of time instants when a plurality of different delay times elapse respectively from a plurality of reference waves included and repeated in series in the signal, thus a plurality of preparing images being produced. An appropriate or optimum ECG-gating time instant is determined using the plurality of preparing images. The imaging MR scan with the region of the patient is then performed in synchronization with the appropriate or optimum ECG-gating time instant. For example, both of the preparing MR scan and the imaging MR scan are based on the same type of pulse sequences. The pulse sequences include a fast SE sequence, a sequence rooted in the fast SE sequence, or a segmented fast FE sequence. Even if the imaging scan is three-dimensional imaging, it is enough that the preparing MR scan is two-dimensional scanning.

51 Claims, 24 Drawing Sheets

MR IMAGING UTILIZING ECG GATING TECHNIQUE

BACKGROUND OF THE INVENTION

1. Field of the Invention

The present invention relates to magnetic resonance imaging for imaging the inside of a subject (patient) on the basis of a magnetic resonance phenomenon occurring in the subject. More particularly, this invention is concerned with a magnetic resonance imaging (MRI) system and magnetic resonance (MR) imaging method which utilize an ECG gating technique employed as a cardiac synchronization technique.

2. Description of the Related Art

Magnetic resonance imaging (MRI) is a technique for magnetically exciting nuclear spins in a subject positioned in a static magnetic field by applying a radio-frequency (RF) signal with the Larmor frequency, and reconstructing an image using an MR signal induced with the excitation.

For imaging the vessels in the lungs or the vessels in the liver (portal vein) according to the magnetic resonance imaging, various requirements must be satisfied. One requirement is to improve a signal-to-noise ratio by raising signal levels representing a vascular image. Another one is to minimize artifacts caused by body motions.

Under those requirements, various types of magnetic resonance imaging methods are used. One method is an echo planar imaging (EPI) method known as ultra-fast imaging, which uses a pulse sequence in which MR signals are acquired by fast reversing the polarities of a read-out gradient after one RF excitation. The EPI imaging has the advantages of shorter data acquisition times and less artifacts caused by the body motion. Another one is imaging based on either a fast SE (spin echo) method or an imaging technique to which the fast SE method is applied, which is a relatively longer acquisition time per one time of RF excitation (i.e., one shot) compared to one heart beat (for example, approx. 300 msec, particularly 600 msec for larger matrix sizes). Imaging based on the fast SE method, which is longer in the acquisition time than an EPI (echo planar imaging) method, has the advantage of higher resistance to susceptibility and less distortions in shapes. Thus, imaging making use of those advantages can be made. An ECG gating technique employed as one of the known cardiac synchronization techniques can be used in those types imaging.

On the other hand, where an object to be imaged is the heart system, imaging can also be performed with FE (gradient field echo) types of pulse sequences having a shorter acquisition time per one time of RF excitation. Particularly, in recent years, a segmented FFE method is frequently used. This seg. FFE method also makes use of the ECG gating technique so that acquisition timing in each segment (i.e. for each heart beat) agrees with each other.

However, the foregoing imaging techniques in which the ECG gating is utilized pose the following unsolved problems.

In other words, there is a problem of optimizing or appropriately setting cardiac synchronization timing. Concerning this problem, the truth is that precise and practical researches have hardly been made in the past. It is assumed that more proper synchronization timing values will surely be present which depend on differences in individuals of patients, differences in regions to be diagnosed (for example, whether a region is nearer to the heart or not), and types of pulse sequences used. However, practical researches or proposals about this synchronization timing have not been made yet. Because of these situations, utilizing an ECG gating technique results in that an operator determines the synchronization timing value by his or her experience or in the try and error approach. In the foregoing imaging techniques, however, a flow void phenomenon is likely to occur, and if occurring, the strength of detected echo signals is reduced, leading to unsatisfied MRA images in which desired flows of blood are not truly captured. Therefore, there is no guarantee that imaging is performed in a steady manner in which the ECG gating is fully effective and objects to be imaged are steadily captured.

For example, for imaging the aorta whose flow speed is relatively high, such as 2 m/sec, there is a possibility that a flow void phenomenon will be caused unless the cardiac synchronization timing is properly set, resulting in failure in imaging.

SUMMARY OF THE INVENTION

The present invention attempts to break through the foregoing current situation of known arts. An object of the present invention to provide MR images of a stable and higher depiction performance by determining an optimum or appropriate cardiac synchronization time for imaging making use of an ECG gating technique.

Another specific object is to provide an MR image of a greater depiction performance, which steadily captures an object, by determining beforehand an optimum or appropriate cardiac synchronization time, when the heart system is scanned in a manner in which ECG gating is combined into sequences whose acquisition times per one time of RF excitation are relatively shorter.

Another object of the present invention is to steadily depict the running directions of tissue or blood flows of shorter T2 relaxation times so that information about their running states is enriched, when the cardiac synchronization time is optimized.

Still another object is to semi-automate or automate operation required to optimize the cardiac synchronization time, so that an operator's entire labor for operation is reduced.

For accomplishing the above objects, a first configuration according to one aspect of the present invention is provided by an magnetic resonance imaging system performing an imaging MR (magnetic resonance) scan based on a cardiac synchronization technique with a appropriate region of an object to be imaged: comprising an element for acquiring a signal indicative of cardiac temporal phases of the object; an element for performing a plurality of times a preparing MR scan with the region at each of different synchronizing time instants measured from a plurality of reference waves repeatedly appearing in the signal, thereby an MR signal being acquired by each scan; an element for producing a plurality of preparing images assigned to the plurality of different synchronizing time instants from the acquired MR signal; and an element for reflecting information about the plurality of preparing images into the imaging MR scan. The information reflecting element can be realized by various modes, such as manual operation, or automatic or semi-automatic operation.

A second configuration according to the one aspect of the present invention is provided by a magnetic resonance imaging system comprising: an element for acquiring a signal indicative of cardiac temporal phases of a patient; an element for performing a plurality of times a preparing MR (magnetic resonance) scan with a region including an object to be imaged of the patient at each of different synchronizing time instants determined based on a plurality of reference waves repeatedly appearing in the signal, thereby MR signals being acquired by each scan; an element for producing a plurality of preparing images using the acquired MR signals; an element for determining an appropriate synchronizing time instant for a cardiac synchronization technique on the basis of the plurality of preparing images; and an element for performing an imaging MR scan with the region of the patient in synchronization with the determined appropriate synchronization time instant.

Preferably, the signal indicative of the cardiac temporal phases is an ECG (electrocardiogram) signal generated by the patient and the cardiac synchronization technique is an ECG-gating technique. In this case, it is preferred that the preparing scan element has an element for changing a delay time from an R-wave, employed as the reference wave, of the ECG signal into a plurality of delay times, and an element for starting the preparing MR scan at each of the synchronizing temporal instants when each of the changed delay times has elapsed.

For example, the object to be imaged is either one of a tissue and blood vessel of the patient having a shorter spin-spin relaxation time of nuclear spins. Alternatively, both of the preparing MR scan and the imaging MR scan can be based on the same type of pulse sequences. By way of example, the pulse sequence falls into either one of a fast SE (spin echo) method and a method being rooted in the fast SE method. Preferably, the pulse sequence has a scan time of not less than appr. 200 msec per one time of RF excitation. Still preferably, the pulse sequence depends on a Fourier transform for reconstructing the MR signals mapped in a frequency space into a real space image, the frequency space being divided into a plurality of blocks in a phase-encoding direction thereof.

It is preferred that the pulse sequence is a segmented fast FE (gradient field echo) pulse sequence. By way of example, the segmented fast FE pulse sequence has a pulse train to acquire a plurality of echo signals at each of a plurality of different time instants residing in between the R-waves and to map the echo signal acquired at the same time instant in each of a plurality of two-dimensional frequency spaces set to a single slice passing the region of the patient.

It is also preferred that the pulse sequence is an EPI (echo planar imaging) pulse sequence.

Still, it is preferred that the pulse sequence used in the preparing MR scan is for a two-dimensional scan and the pulse sequence used in the imaging MR scan is for a three-dimensional scan.

On one hand, in the above second configuration, the object consists of a plurality of types of objects; the preparing MR scan performing element has an element for performing the preparing MR scan object by object in a phase-encoding direction in agreement with each of the plurality of type of objects; the preparing image producing element is constructed to produce the plurality of preparing images object by object from the MR signals acquired through the preparing MR scan; the appropriate synchronizing time instant determining element is constructed to determine the appropriate synchronizing time instant object by object on the basis of the plurality of preparing images; and the imaging MR scan performing element has an element for performing the imaging MR scan object by object not only in synchronization with the appropriate synchronizing time instant determined every object but also in a phase-encoding direction in agreement with a running direction of each of the plurality of objects.

According to another aspect of the present invention, provided a method of magnetic resonance imaging in which a signal indicative of a cardiac temporal phase of a patient is acquired, comprising the steps of: first performing a preparing MR (magnetic resonance) scan with a region containing an object to be imaged of the patient to start at each of a plurality of time instants when a plurality of different delay times elapse respectively from a plurality of reference waves included and repeated in series in the signal, thus a plurality of preparing images being produced; determining an appropriate synchronizing time instant for electrocardiogram (ECG) gating using the plurality of preparing images; and second performing an imaging MR scan with the region of the patient in synchronization with the appropriate synchronizing time instant.

According to the above configurations, prior to a cardiac synchronizing MR imaging scan, the cardiac synchronization time instant, such as an ECG-gating time instant, is appropriately or optimizedly determined depending on given imaging conditions through a preparing MR scan, thereby making sure that the imaging scan be performed with stable and higher depiction performance of MR images.

Further, in the above second configuration, the preparing MR scan performing element includes an element for making phase-encoding direction for the preparing MR scan agree with a running direction of the object. According to this configuration, the blurring of pixel values in the phase-encoding direction and the running directions of such objects as flows of blood coincide with each other, performance to depict the running directions is increased in preparing images. This feature helps to raise accuracy in determining the cardiac synchronization time instant.

Still further, in the above second configuration, further comprising an element for instructing the patient to execute a breath hold for a period during which the preparing MR scan is performed. Using the breath hold technique reduces body motions of a subject or patient during the preparing MR scan, providing preparing MR images with less artifacts. This leads to a higher accuracy in determining the cardiac synchronization time instant.

Still further, in the above second configuration, the appropriate synchronizing time instant determining element has an interface element for representing the plurality of preparing images to an operator as well as accepting a region of interest that the operator desires and an element for setting the appropriate synchronizing time instant using data associated with strength of the echo signal acquired from the region of interest. By way of example, the appropriate synchronizing time instant determining element further has an element for automatically reflecting the set appropriate synchronizing time instant into a sequence used in the imaging MR scan. By way of another example, the interface element has an element for superposedly displaying information indicative of each of the plurality of different time instants on each of the plurality of preparing images. Still another example is that the interface element has a ROI (region of interest) inputting element used by the operator to input the region of interest with a ROI; and the setting element has an element for calculating a signal strength distribution from pixel values corresponding in position to the ROI and an element for obtaining the appropriate synchronizing time instant from the signal strength distribution with a given algorithm.

As a result, the operator's manual work in determining the cardiac synchronization time instant can be remarkably reduced or omitted.

The remaining features of the invention will be clearly understood from the description of various preferred embodiments, which are described with accompanying drawings below.

DESCRIPTION OF THE PREFERRED EMBODIMENTS

Figure 1:
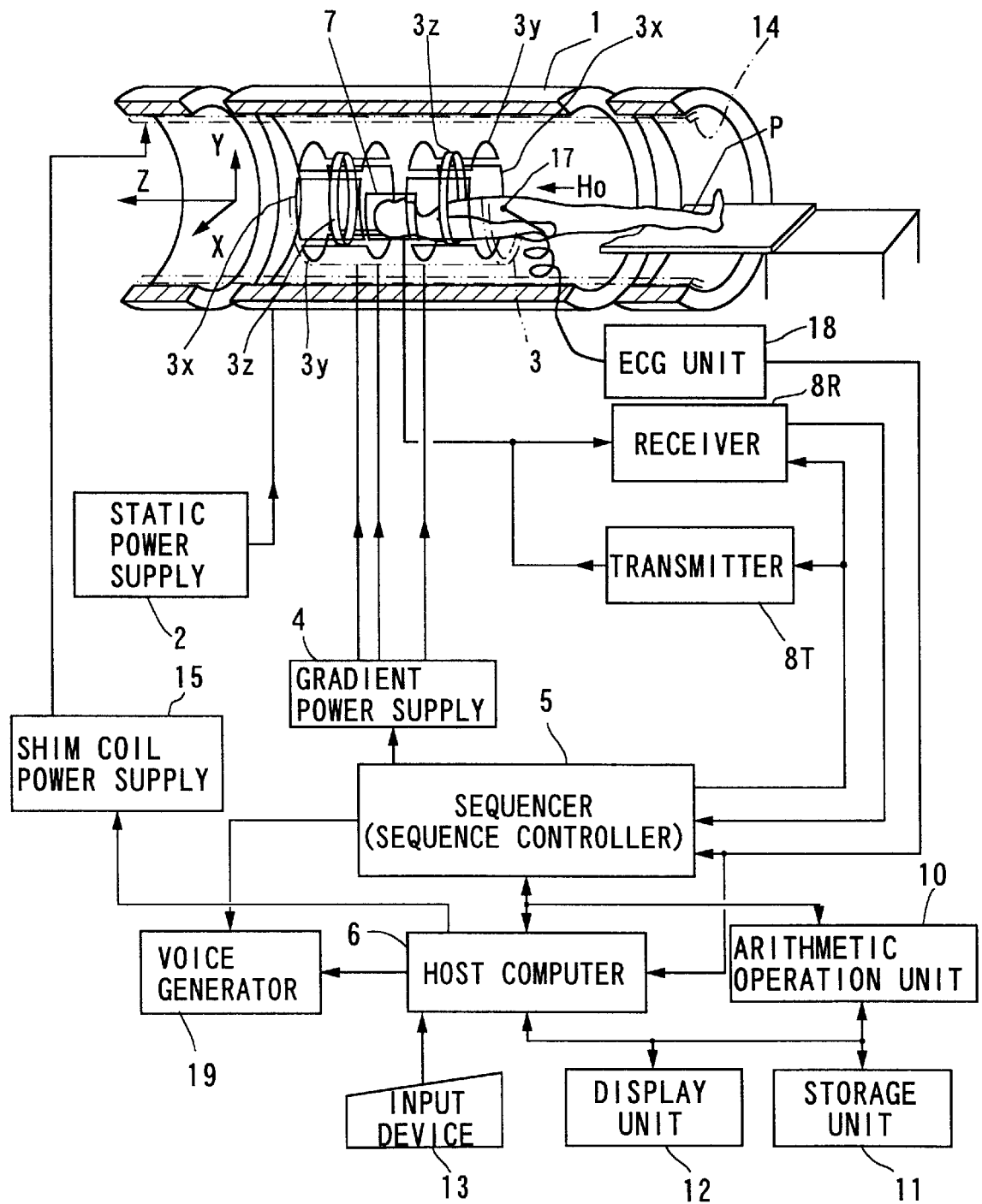
FIG. 1 is a block diagram showing an example of an MRI system used in various embodiments of the present invention.

FIG. 1 shows the outline configuration of a magnetic resonance imaging (MRI) system in accordance with the embodiments of the present invention.

The MRI system comprises a patient couch on which a patient P lies down, static magnetic field generating components for generating a static magnetic field, magnetic field gradient generating components for appending positional information to a static magnetic field, transmitting/receiving components for transmitting and receiving a radio-frequency (RF) signal, control and arithmetic operation components responsible for control of the whole system and for image reconstruction, electrocardiographing components for acquiring an ECG signal of a patient, which is a representative of signals indicative of cardiac temporal phases of the patient, and breath hold instructing components for instructing the patient on breath hold.

The static magnetic field generating components includes a magnet 1 that is of, for example, a superconducting type, and a static power supply 2 for supplying a current to the magnet 1, and generates a static magnetic field $H_0$ in an axial direction (Z-axis direction) in a cylindrical bore (diagnostic space) into which the patient P is inserted. The magnet unit includes shim coils 14. A current used to homogenize a static magnetic field is supplied from a shim coil power supply 15 to the shim coils 14 under the control of a host computer to be described later. The couch top of the patient couch on which the patient P lies down can be inserted into the bore of the magnet 1 so that the couch top can be withdrawn.

The magnetic field gradient generating components includes a gradient coil unit 3 incorporated in the magnet 1. The gradient coil unit 3 includes three pairs (kinds) of x-, y-, and z-coils 3x to 3z used to generate magnetic field gradients changing in strength in X-axis, Y-axis, and Z-axis directions that are mutually orthogonal. The magnetic field gradient generator further includes a gradient power supply 4 for supplying a current to the x, y, and z coils 3x to 3z. The gradient power supply 4 supplies a pulsating current used to generate a magnetic field gradient to the x-, y-, and z-coils 3x to 3z under the control of a sequencer that will be described later.

The pulsating current supplied from the gradient power supply 4 to the x-, y-, and z-coils 3x to 3z is controlled, whereby magnetic field gradients changing in the three axial directions, that is, the X, Y, and Z directions are synthesized. Thus, directions in which a slice selective magnetic field gradient $G_S$, a phase-encoding magnetic field gradient $G_E$, and a readout (frequency-encoding) magnetic field gradient $G_R$ are applied can be specified and changed arbitrarily. The magnetic field gradients to be applied in a slice direction, a phase-encoding direction that is a direction the distribution of spins in which is phase-encoded, and a readout direction that is a direction in which an MR signal is read are superposed on the static magnetic field $H_0$.

The transmitting/receiving components includes a radio-frequency (RF) coil 7 located in the vicinity of a patient P in the scanning space inside the magnet 1, and a transmitter 8T and receiver 8R connected to the coil 7. Under the control of a sequencer described later, the transmitter 8T supplies RF current pulses with the Larmor frequency, which are used to excite spins to cause nuclear magnetic resonance (NMR), while the receiver 8R receives an echo signal (RF signal) via the RF coil 7, and carries out various kinds of signal processing with the echo signal so as to produce a corresponding digital echo signal.

Furthermore, the control and arithmetic operation components includes a sequencer 5 (also referred to as sequence controller), a host computer 6, an arithmetic operation unit 10, a storage unit 11, a display unit 12, and an input unit 13. Among them, the host computer 6, which has a CPU and memories, has the function of providing the sequencer 5 information about a pulse sequence and managing the operations of the entire system, according to installed software programs. One example of scan control executed by the host computer 6 will be described later.

Figure 2:
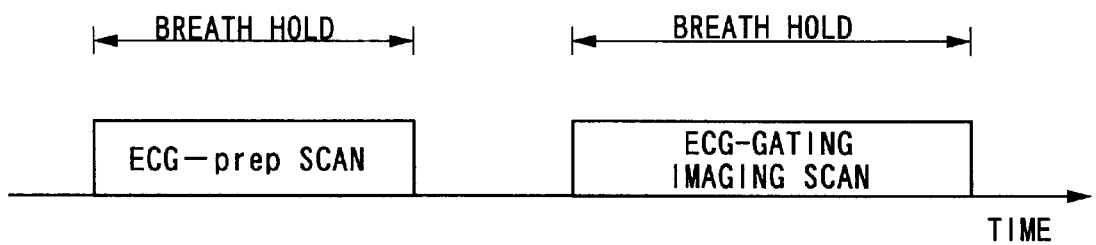
FIG. 2 pictorially shows a temporal relation between an ECG-prep scan and an ECG-gating imaging scan in a first embodiment of the present invention.
Figure 3:
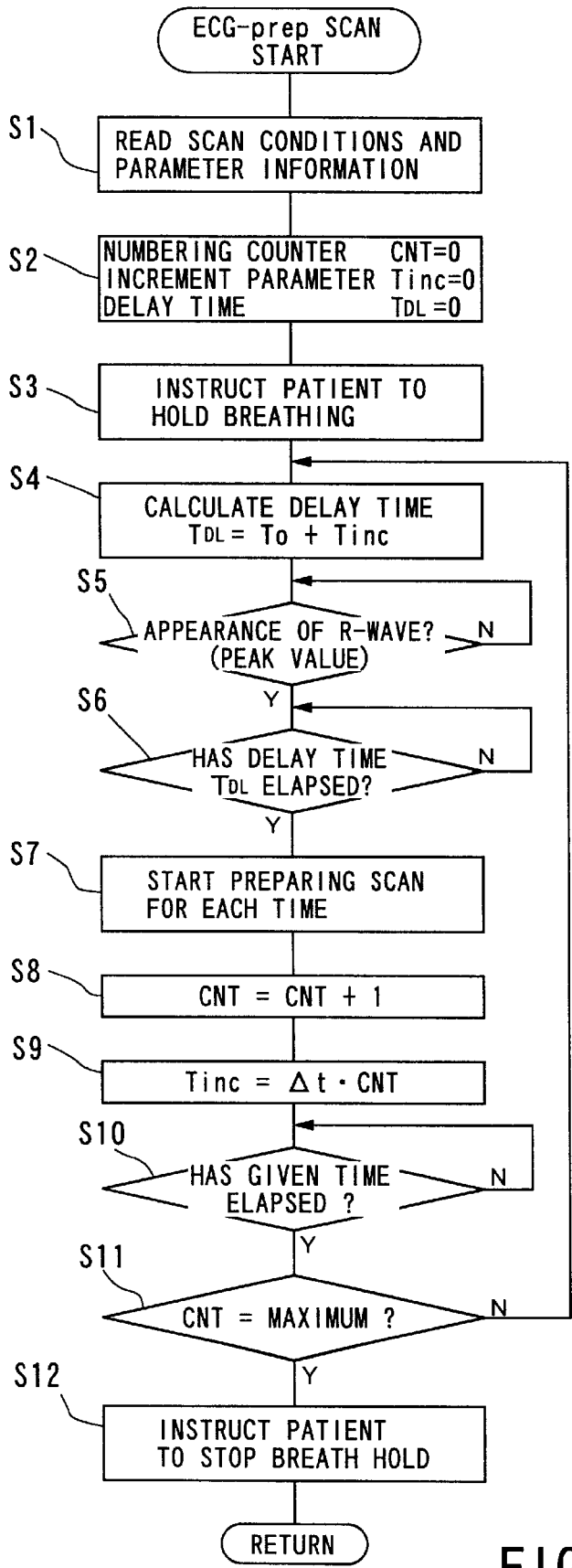
FIG. 3 is a flowchart outlining an example of an ECG-prep scan executed by a host computer.

The MRI system has a feature of performing a cardiac synchronization imaging scan at a predetermined cardiac synchronization time. To be specific, the host computer 6 performs a preparing MR scan and imaging MR scan, as shown in FIG. 2, in the execution of a main program not shown. The preparing MR scan, hereinafter referred to as "ECG-prep scan", is used for performing a preparing sequence for predetermining a synchronization time incorporated into the imaging MR scan which follows the preparing MR scan. The imaging MR scan, hereinafter referred to as "imaging scan", is used for performing a sequence using a cardiac synchronization method based on the synchronization time predetermined by the ECG-prep scan. FIG. 3 exemplifies an execution routine for the ECG-prep scan, and FIG. 8 does that for the cardiac-synchronizing imaging scan. In FIG. 2, although not shown, a scan for positioning of a region to be scanned precedes the ECG-prep scan. In the present embodiment, as the cardiac synchronization method, an ECG-gating method is used.

The sequencer 5, which has a CPU and memories, stores pulse-sequence information sent from the host computer 6, and controls a series of operations to be performed by the gradient power supply 4, transmitter 8T, and receiver 8R according to the stored information. What is referred to as pulse-sequence information is all information required for operating the gradient power supply 4, transmitter 8T, and receiver 8R according to a pulse sequence. For example, pulse-sequence information includes information concerning the strength of a pulsating current to be applied to the x-, y-, and z-coils 3x to 3z, and the application time and timing thereof. Additionally the sequencer 5 receives the digital echo data from the receiver 8R and transfer them to the arithmetic operation unit 10.

As for the pulse sequence, a pulse sequence used for either two-dimensional (2D) scan or three-dimensional (3D) scan will do as long as a Fourier transform can be applied for image reconstruction. Moreover, the pulse sequence may be a pulse train to be applied according to any of MR imaging techniques; spin echo (SE) method, gradient field echo (FE) method, fast SE (FSE) method, echo planar imaging (EPI) method, and fast asymmetric SE (FASE) method which incorporates a half Fourier technique into the FSE method.

When pulse sequences derived from the above methods are used, an acquisition time for one time of RF excitation (namely one shot) is in a range of approximately 200 to 1000 msec. The acquisition time can be realized by appropriately selected scan parameters. For example, where one-shot FASE method (2D or 3D) is used, the scan parameters for typical acquisition times are as follows:

(a) for an acquisition time=200 msec;
matrix size in the phase-encoding direction=64
echo train spacing (ETS)=5 msec
effective TE ($TE_{eff}$)=40 msec, (b) for an acquisition time=appr. 300 to 400 msec;
matrix size in the phase-encoding direction=128
echo train spacing (ETS)=5 msec
effective TE ($TE_{eff}$)=40 msec
(in this case, an actual acquisition time is 360 msec.), (c) for an acquisition time=appr. 600 to 700 msec;
matrix size in the phase-encoding direction=256
echo train spacing (ETS)=5 msec
effective TE ($TE_{eff}$)=40 msec
(in this case, an actual acquisition time is 680 msec.), (d) for an acquisition time=appr. 1000 msec (type 1);
matrix size in the phase-encoding direction=256
echo train spacing (ETS)=8 msec
effective TE ($TE_{eff}$)=64 msec
(in this case, an actual acquisition time is 1088 msec.), and (e) for an acquisition time=appr. 1000 msec (type 2);
matrix size in the phase-encoding direction=512
echo train spacing (ETS)=4 msec
effective TE ($TE_{eff}$)=64 msec
(in this case, an actual acquisition time is 1088 msec.).

The arithmetic operation unit 10 receives digital echo data sent from the receiver 8R via the sequencer 5, maps the data in a Fourier space (or the k-space or frequency space) formed in an incorporated memory, and performs a two-dimensional or three-dimensional Fourier transform with the mapped data so as to reconstruct an image in the real space. Moreover, the arithmetic operation unit 10 carries out mutual synthesis of reconstructed image data. The Fourier transform may be performed by the host computer 6, not the sequencer 5.

A preferred example of synthesis is addition in which reconstructed image data items of a plurality of frames are added up pixel by pixel or maximum intensity projection (MIP) in which a maximum pixel value is selected pixel by pixel from among reconstructed image data items of a plurality of frames. Addition includes simple addition, averaging, and weighting and addition. Another example of synthesis is such that axes associated with a plurality of frames in the Fourier space are matched with one another and raw echo data items are synthesized as they are in order to produce raw echo data of one frame.

The storage unit 11 can preserve not only raw echo data and reconstructed image data but also image data having undergone synthesis. The display unit 12 displays an image, and can be used to input to the host computer 6 desired information entered at the input unit 13 by an operator; such as, information about parameters for determining an ECG gating time, scan conditions, a pulse sequence, and a technique of image synthesis.

The voice generator 19, which consists of a constituent of the breath hold instructing components, utters, for example, a voice message informing a patient of the start or end of breath hold in response to a command sent from the host computer 10.

Furthermore, the electrocardiographing components comprises an ECG sensor 17 attached to the patient body to detect an electric ECG signal and an ECG unit 18 performing various processes including digitization with the detected ECG signal and sending it to both the host computer 6 and the sequencer 5. This measured ECG signal is used by the host computer 6 and the sequencer 7 to perform both the ECG-prep scan and the ECG-gating imaging scan. This enables the optimum setting of ECG-gating time (i.e. cardiac synchronization time) for the ECG gating method (i.e., cardiac synchronization method). An ECG-gating imaging scan based on the set gating time is therefore carried out for acquiring MR unprocessed (raw) echo data.

(First Embodiment)

Referring to FIGS. 3 to 6, processing for predetermining an ECG-gating time will now be explained.

The host computer 6, which is in operation for a given main program not shown, responds to a command from the input device 13 and commences an execution routine for the ECG-prep scan shown in FIG. 3.

First, the host computer 6 reads from the input device 13 scan conditions and information about parameters both required to perform an ECG-prep scan (Step S1). The scan conditions includes a type of scan, a type of pulse sequence, and a phase-encoding direction. Parameter information includes an initial time $T_0$ to determine an ECG-gating time (herein, $T_0$ is defined as a time instant delayed from an R-wave peak time instant in the ECG signal), a time increment $\Delta t$, and a maximum limit of a numbering counter CNT. These parameters can properly be set by an operator.

The host computer 6 then initializes the numbering counter CNT counting the execution times of the ECG-prep scan, a time increment parameter $T_{inc}$ and delay time $T_{DL}$ both determining the ECG-gaining time ($C_{NT}=0$, $T_{inc}=0$, $T_{DL}=0$; Step S2). After this, the host computer 6 sends to the voice generator 19 data making it generate a voice message for breath hold toward the patient P, the message being, for example, "hold breathing, please" (Step S3). It is preferred that the breath hold is performed for suppression of body motions of a patient which may be caused during the ECG-prep scan. However, the breath hold may be omitted in some occasions.

After having completed the above preparation, the host computer 6 sequentially executes processes shown after Step 3. This execution permits the scan with the changed ECG-gating times.

Specifically, $T_{DL}=T_0+T_{inc}$ is calculated to obtain a delay time $T_{DL}$ from the peak time instant of an R-wave (Step S4). The ECG signal subjected to the signal processing in the ECG unit 18 is then read and whether or not the R-wave peak value has been appeared in the ECG signal is determined (Step S5). This determination will be repeated until the R-wave appears. When the R-wave appears (Yes at Step S5), it is then determined whether or not the delay time $T_{DL}$ calculated at Step S4 has elapsed since the appearance of the R-wave peak (Step S6). This determination will also be repeated until the delay time $T_{DL}$ elapses.

Figure 4:
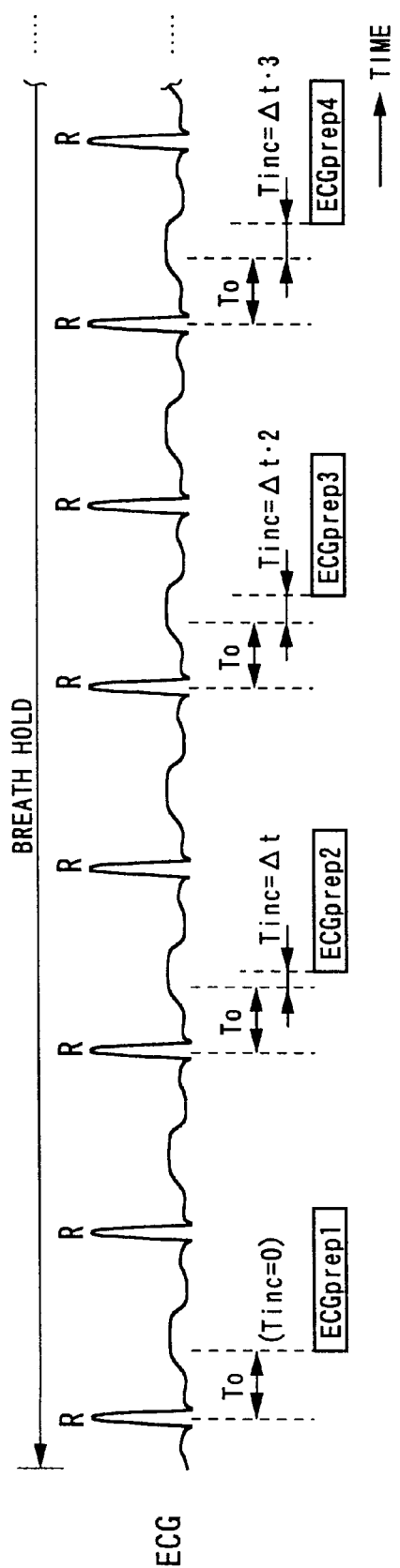
FIG. 4 is one example of a timing chart showing the ECG-prep scan.

When the time has passed by the delay time $T_{DL}$ since the R-wave peak time instant (Yes at Step S6), the sequencer 5 is ordered to start a pulse sequence for each time of scanning (Step S7, refer to FIG. 4). It is preferred that the above pulse sequence is the same in type as an imaging pulse sequence.

Further, in view of the fact the ECG-prep scan is just used to set an ECG-gating delay time that can maximize the strength of an MR signal from objects to be imaged, the ECG-prep scan can be done by two-dimensional scanning as long as the objects are contained in a two-dimensional region, even when an ECG-gating imaging scan is performed in a there-dimensional basis. Setting two-dimensional ECG-prep scans contributes to the minimization of the whole imaging time. If the ECG-gating imaging scan is based on a two-dimensional one, the ECG-prep scan is, of course, fully satisfied with two-dimensional scanning. Alternatively, the ECG-prep scan may be lowered to some extent in spatial resolution (for example, matrix sizes) than the ECG-gating imaging scan.

In this embodiment, as the ECG-prep scan, a two-dimensional FASE (2D-FASE) method is used which incorporates a half-Fourier technique into an FSE method. Alternatively, such two-dimensional scans as a plain SE, FSE, EPI, segmented FFE, or other method may be adopted.

In response to this start command, the sequencer 5 starts the execution of a pulse sequence of which type is designated by an operator, so that a desired section in a patient P is two-dimensionally scanned.

After the output of the sequence start command, the numbering counter CNT is incremented such that CNT=CNT+1 (Step S8), then the time increment parameter $T_{inc}$ is computed such that $T_{inc}=\Delta T \times CNT$ (Step S9). In other words, every time when the pulse sequence is ordered to be executed, the count of the counter CNT increases by one and the increment parameter $T_{inc}$ adjusting the ECG-gating time increases in proportion to the count.

Then, a standby state continues until a predetermined period (for example, more than 700 msec) necessary for the execution of the pulse sequence for each scan time elapses (Step S10). Then, whether the count of the numbering counter CNT reaches a preset maximum or not is determined (Step S11). In cases where five two-dimensional images are produced, for example, with the delay time $T_{DL}$ changed into various values for the purpose of optimizing the ECG-gating time, the count in the counter CNT is set to "5". If the count has not reached the maximum (No at Step S11), the processing is returned to Step S4 to repeat the above processing. On the contrary, the count in the counter CNT equals the maximum (Yes at Step S11), a command to end the breath hold is sent to the voice generator 19 (Step S12), then the processing returns to the main program. A voice message to release the patient from breath hold is such that "you can breathe".

Executing the above processes sequentially leads to a timing chart exemplified by FIG. 4 where a preparing pulse sequence is repeatedly executed every other heart beat. For example, when the initial time $T_0=300$ msec and the time interval $\Delta T=100$ msec are set, the delay time $T_{DL}$ for each time of scanning is adjusted to 300 msec for the first time, 400 msec for the second time, 500 msec for the third time, etc. in turn. Therefore, when the first R-wave peak value appears after the breath hold message was generated, the first ECG-prep scan ECGprep1 is executed so that it lasts for a certain period (for example, appr. 700 msec) from a certain time instant when the delay time $T_{DL}(=T_0)$ has elapsed after the R-wave peak appearance, based on, for example 2D-FASE method, whereby providing echo signals. Whenever the next R-wave may appear in the execution of the first sequence, the foregoing standby process at Step S10 in FIG. 3 makes the sequence continue regardless of the R-wave which appeared in the course of execution. Namely, once the sequence is executed stated in synchronization with a certain heart beat (R-wave), the execution can continue over the succeeding one or more heart beats to acquire necessary echo signals.

Unless the count in the numbering counter CNT has yet been its maximum, Steps S5 to S11 shown in FIG. 3 will be processed again. Thus, in the embodiment as in FIG. 4, when the peak value of the third R-wave is accomplished, and the delay time $T_{DL}=T_0+T_{inc}=400$ msec passes, the second ECG-prep scan ECGprep2 is launched and continued for the given period, echo signals being acquired. When the next R-wave appears after the second sequence, and the delay time $T_{DL}=T_0+2\times T_{inc}=500$ msec passes, the third ECG-prep scan ECGprep3 is started and continues for the given period, echo signals being acquired. In the same manner, when the next R-wave appears after the third sequence, and the delay time $T_{DL}=T_0+3\times T_{inc}=600$ msec passes, the fourth ECG-prep scan ECGprep4 is started and continues for the given period to acquire echo signals. The scan is repeated by desired times, for example, five times to acquire five frames of echo data from the same cross section in the patient.

The echo data are sent to the arithmetic operation unit 10 via the sequencer 5, where they are mapped in a Fourier space to be reconstructed into a real space image by a two-dimensional Fourier transform. The reconstructed image data are stored in the storage unit 11 as MRA image data. The MRA image data of a plurality of frames are displayed in a cyclic mode responsively to an operation from the input device 13, for example.

FIGS. 5A to 5E represents a plurality of MRA images of which delay times (i.e. ECG-prep gating times) are altered dynamically over a plurality of heart beats. These drawing images which represent the lungs are visualized by hand-tracing actual picture images acquired under the conditions in which a 2D-FASE method (effective TE ($TE_{eff}$)=40 msec, echo train spacing ETS=5 msec, the number of shots=1, slice thickness (ST)=40 mm, the number of slices (NS)=1, the number of addition (NAQ)=1, matrix size=256×256, FOV= 40×40 cm, and actual acquisition time=appr. 700 msec) is used and the phase encoding direction agrees with the longitudinal direction of the drawings (i.e. body axis direction). An objective blood flow in the images the aorta descendents. The delay times $T_{DL}$ are 300 msec in FIG. 5A, 400 msec in FIG. 5B, 500 msec in FIG. 5C, 600 msec in FIG. 5D, and 700 msec in FIG. 5E, respectively.

Figure 5A:
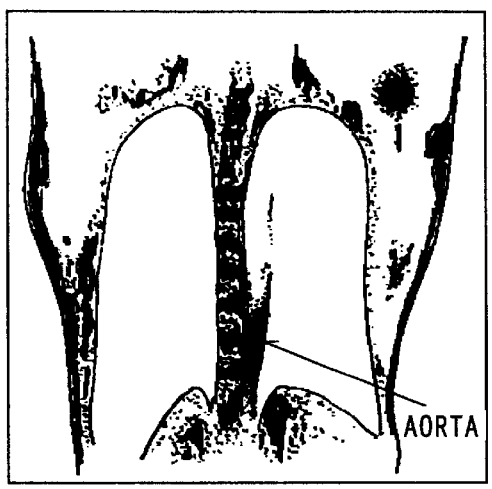
FIGS. 5A to 5E are explanatory images of the lungs sketched by hand from actual MRA picture images acquired through the ECG-prep scan with changed delay times.
Figure 5B:
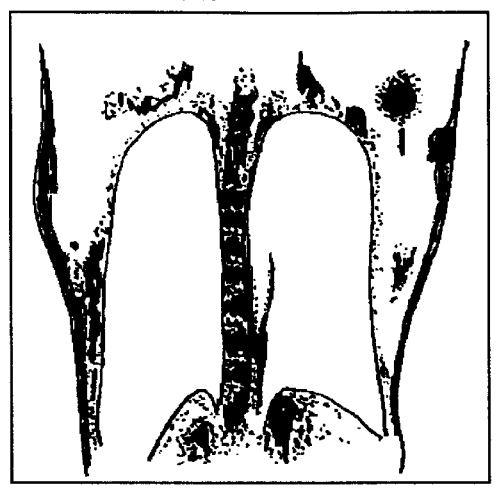
Figure 5C:
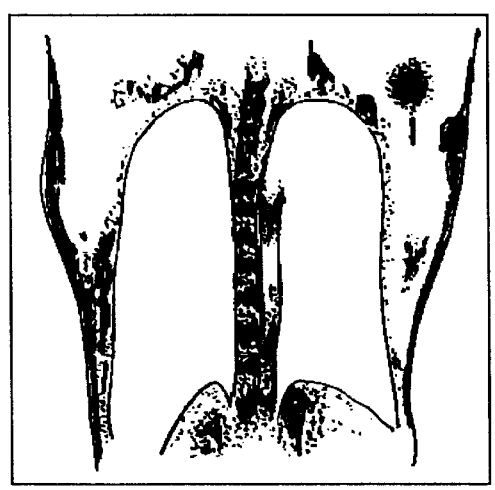
Figure 5D:
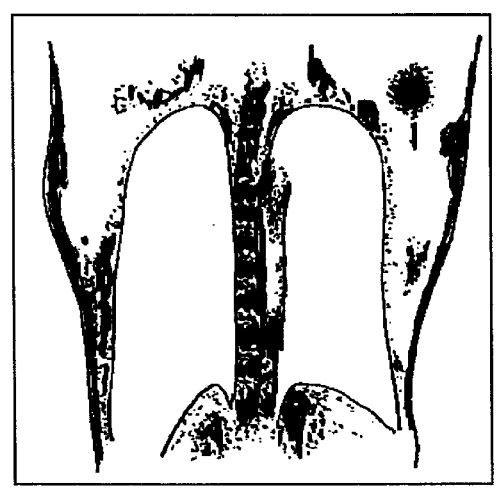
Figure 5E:
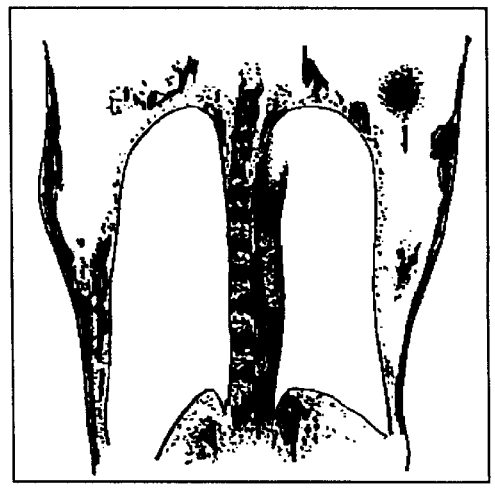

By visual observation toward the cyclically displayed images, selected is the MRA image of FIG. 5E in which the strength of echo signals emanated from the aorta flow is the highest and the entire aorta are most clearly shown. Compared with the FIG. 5E image, the remaining MRA images in FIGS. 5A to 5D show the aorta images whose ranges are limited to shorter portions. It is considered that the scanning for FIGS. 5A to 5D was made in states close to flow void phenomena, due to faster speeds of the blood caused by the heart beats, rather reducing the echo signal strength. In consequence, for acquiring MRA images of the aorta flow in the lungs, this experiment shows that the state in FIG. 5E, i.e., the delay time $T_{DL}=700$ msec is most proper. Thus, an optimum ECG-gating time is decided to be 700 msec delayed from an R-wave peak.

Therefore the operator it to provide by hand a parameter corresponding the determined optimum ECG-gating time for an ECG-gating imaging scan which will be carried out successively.

By the way, in the ECG-prep scan, the phase-encoding direction is deliberately set to agree with the running direction of the aorta (i.e., body axis direction). This setting enables clear imaging by which information about the running direction of the aorta flow (i.e. ability to represent directional property) is not reduced or omitted, compared to cases where the phase-encoding direction is set to directions other than the aorta running direction. The reason for this greater depiction performance is as follows.

Figure 6:
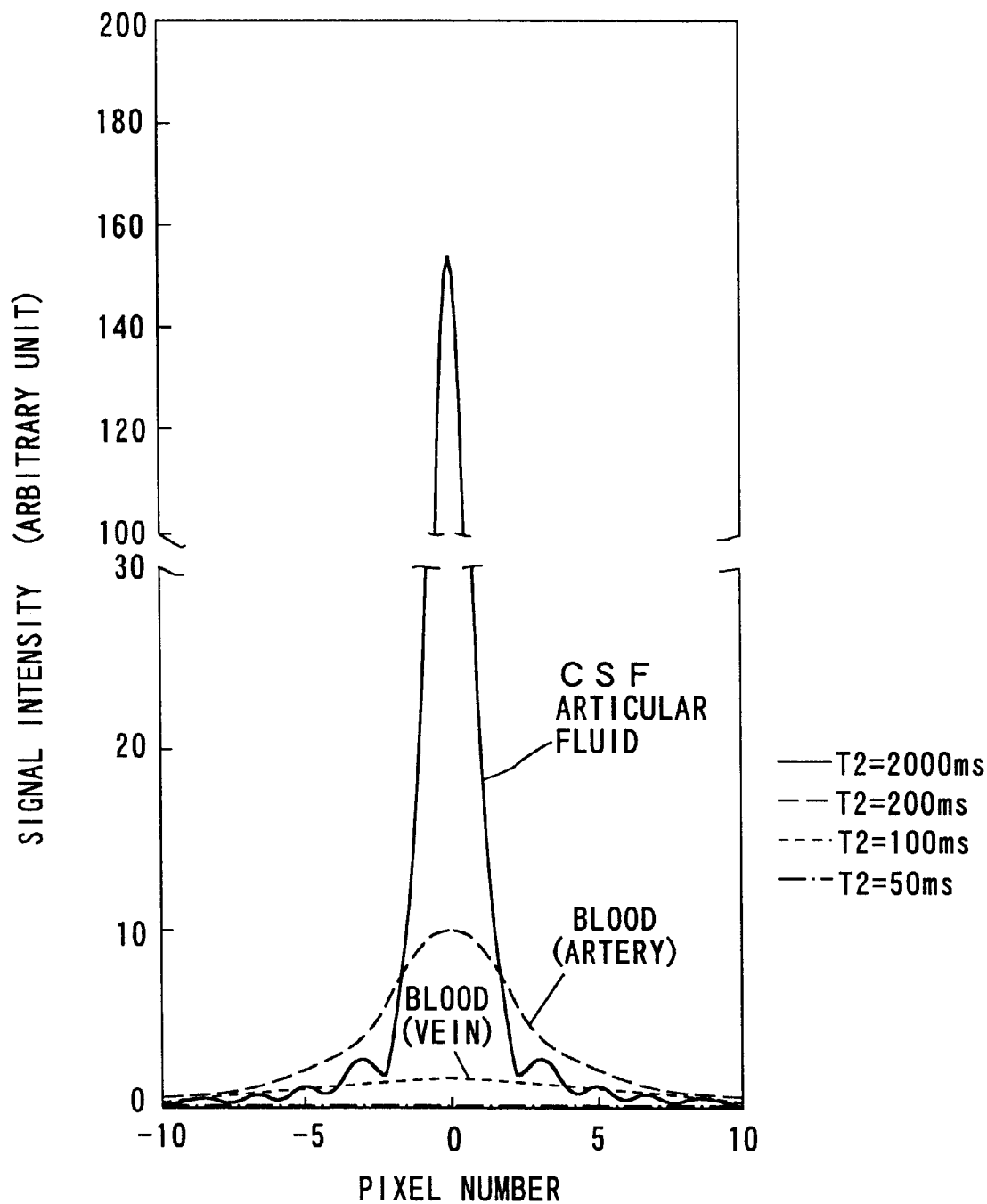
FIG. 6 is a graph for explaining the spread of signal levels along an axis of abscissae indicating a phase-encoding direction.

In general, a blood flow typical of the pulmonary vessels and hepatic vessels (portal vein) is known to exhibit a rather short time $T_2$ (ranging from 100 to 200 milliseconds). It has been revealed that the half-width of a function of a signal induced by a blood flow exhibiting the rather short time $T_2$ is larger than that of a function of a signal induced by the cerebrospinal fluid (CSF) or articular fluid ($T_2>2000$ msec). This is described in, for example, the literature entitled "The loss of small objects in Variable TE imaging: Implications for FSE, RARE, and EPI" written by R. Todd Constable and John C. Gore (Magnetic Resonance in Medicine, Vol. 28, P.9–24, February of 1992). According to the literature, spreads of signal levels induced by materials exhibiting different times $T_2$ are, as shown in FIG. 6, expressed by "point spread functions." The graph of FIG. 6 plots the functions observed under the conditions that the static magnetic field strength is 1.5 T, the time $TE_{eff}$ is 240 milliseconds, and the inter-echo time spacing (ETS) is 12 milliseconds. The axis of abscissae indicates the number of pixels in a phase-encoding direction in an image, and the axis of ordinates indicates the signal intensity expressed in any unit. Compared with the function of the signal intensity induced by the CSF or articular fluid exhibiting a time $T_2$ of 200 milliseconds, the function of the signal intensity induced by blood (artery) exhibiting a time $T_2$ of 200 milliseconds has a larger half-width. This can be said to be apparently equivalent to the situation in which the width in phase-encoding direction in the image of the blood (artery) exhibiting the time $T_2$ of 200 milliseconds is larger than that in the image of the CSF or articular fluid (each pixel in the image of the blood is stretched). This means that the whole image of the blood (artery) exhibiting the time $T_2$ of 200 milliseconds is blurred in the phase-encoding direction to a greater extent than that of the CSF or articular fluid.

Therefore, by making the phase-encoding direction agree with a blood flow direction, the situation that blood vessels of shorter $T_2$ relaxation times are large than those of longer $T_2$ relaxation times in degrees of spread (blur) on pixels of signal values in the phase-encoding direction can be utilized positively, resulting in enhanced blood flow directions. This helps select an optimum MRA image showing an optimum delay time and raises reliability in the selection.

Referring to FIGS. 7 to 10, an ECG-gating imaging scan will be described which will follow the foregoing ECG-prep scan.

Figure 7:
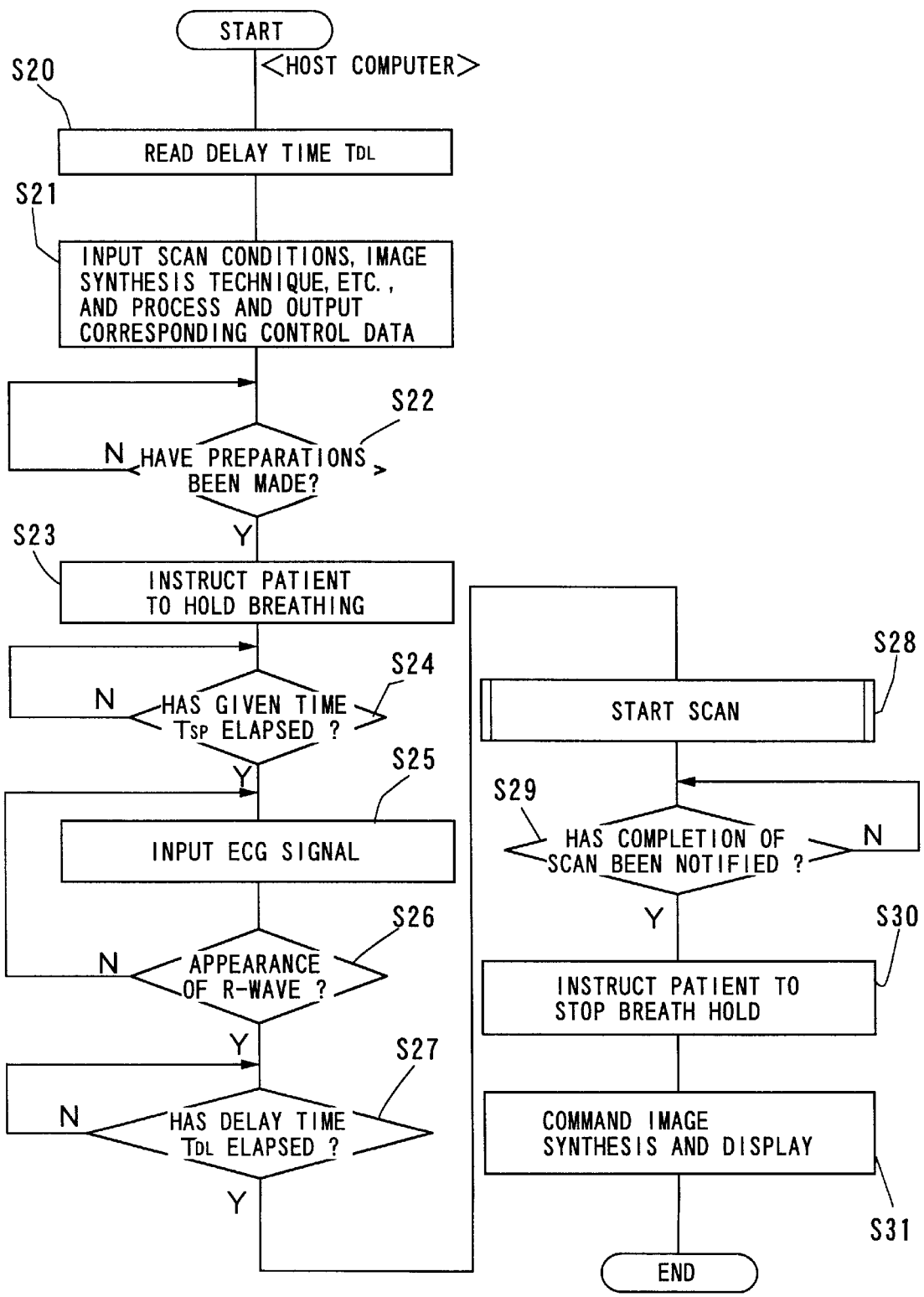
FIG. 7 is a flowchart outlining an example of an ECG-gating imaging scan to be executed by the host computer.

The host computer executes the processes shown in FIG. 7 in response to operation by way of the input device 13.

Specifically, the host computer 6 reads from the input device 13 the optimum delay time $T_{DL}$ determined or selected by the operator through the ECG-prep scan (Step S20)

Then, at step S21, the host computer 6 inputs scan conditions (for example, an image size, the number of scans, a standby time between scans, and a pulse sequence dependent on a region to be scanned) and information of a technique of image synthesis (synthesis of reconstructed images, synthesis in the frequency space, addition, or MIP. In the case of addition, simple addition, averaging, or weighting and addition), processes control information according to the input information, and outputs the control information to the sequencer 5 and arithmetic operation unit 10.

During the processing of step S21, the host computer 6 automatically calculates an angle by which a phase-encoding direction is changed according to the number of scans required for image synthesis (that is, the number of images to be produced for the same region to be imaged), appends angle-change information, that is, information of the angle by which the phase-encoding direction for each scan is changed to a pulse sequence, and transmits the information to the sequencer 5. According to the angle-change information, when the number of images to be synthesized is, for example, two, after the first scan is completed, before the second scan is executed, the phase-encoding direction set for the first scan is changed by 90°.

If it is judged at step S22 that an instruction indicating the completion of preparations has been issued, a command indicating the start of breath hold is output to the voice generator 19 at step S23. This causes the voice generator 19 to utter a voice message saying "Hold breathing, please." In response to this message, the patient holds breathing (See FIG. 9).

After commanding the start of breath hold, the host computer 6 stands by as it is for a given adjusting time interval $T_{cp}$ (for example, one second) at step 24, and thus adjusts timing to allow the patient to surely hold breathing.

After waiting during the adjusting time $T_{SP}$, the host computer 6 executes processes concerning an ECG signal (Steps S25 to S27). First the ECG signal is received, and the processing is awaited with the ECG signal monitored until an R-wave peak appear therein. When the peak appears, the processing is brought into a waiting period corresponding to the delay time $T_{DL}$ read in Step S20 (Step S27). The delay time $T_{DL}$ has been optimized such that the echo signal strength is higher, and depiction performance are raised for objective blood flows or tissues.

The initial adjusting time $T_{SP}'$ from the breath hold start command to the first R-wave appearance becomes an amount made up of by adding to the fixed adjusting time $T_{SP}$ a flexible time β ranging from a time instant when the time $T_{SP}$ elapsed to the R-wave appearance.

Figure 8:
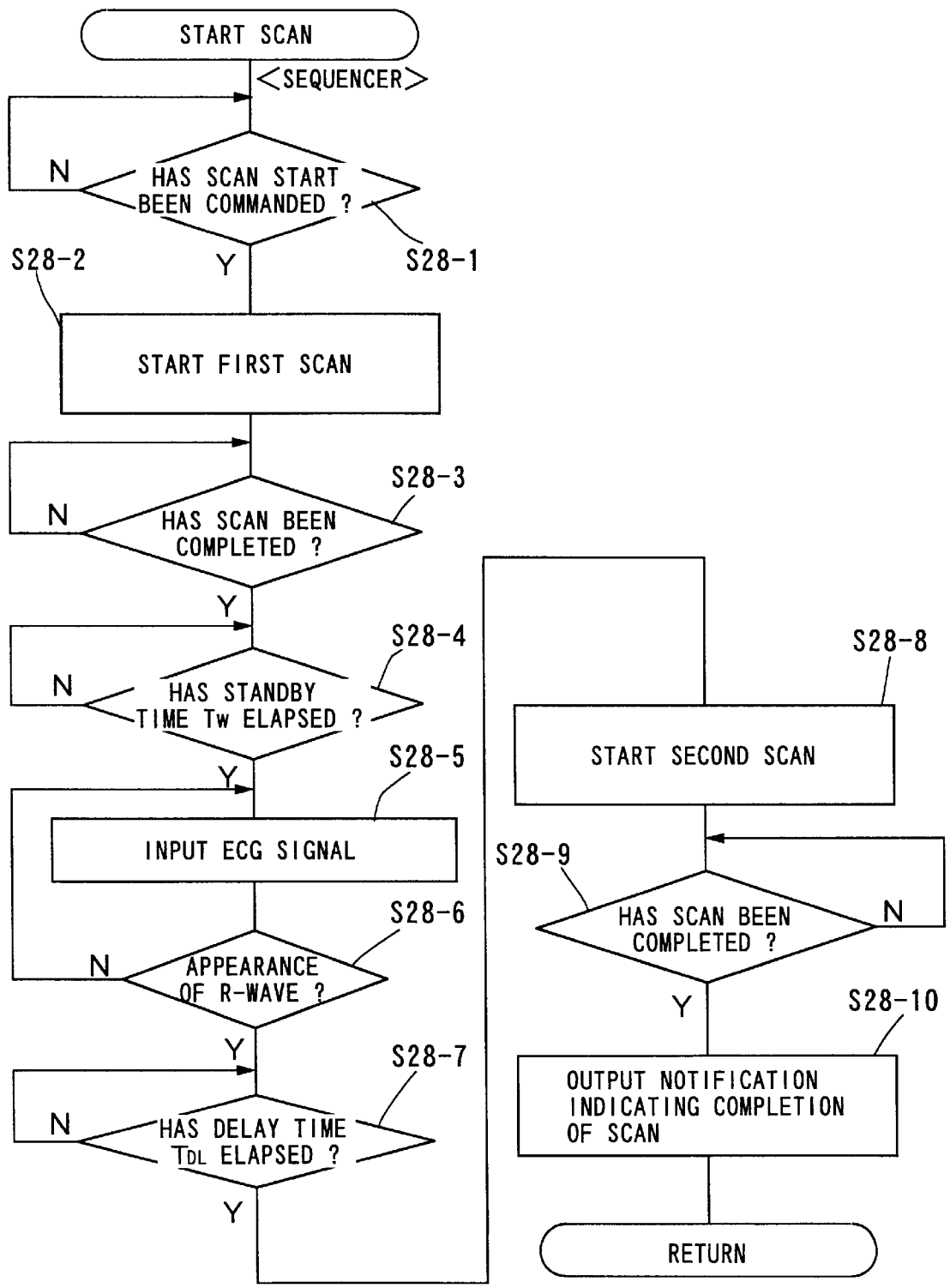
FIG. 8 is a flowchart outlining an example of the imaging scan to be executed by a sequencer.
Figure 9:
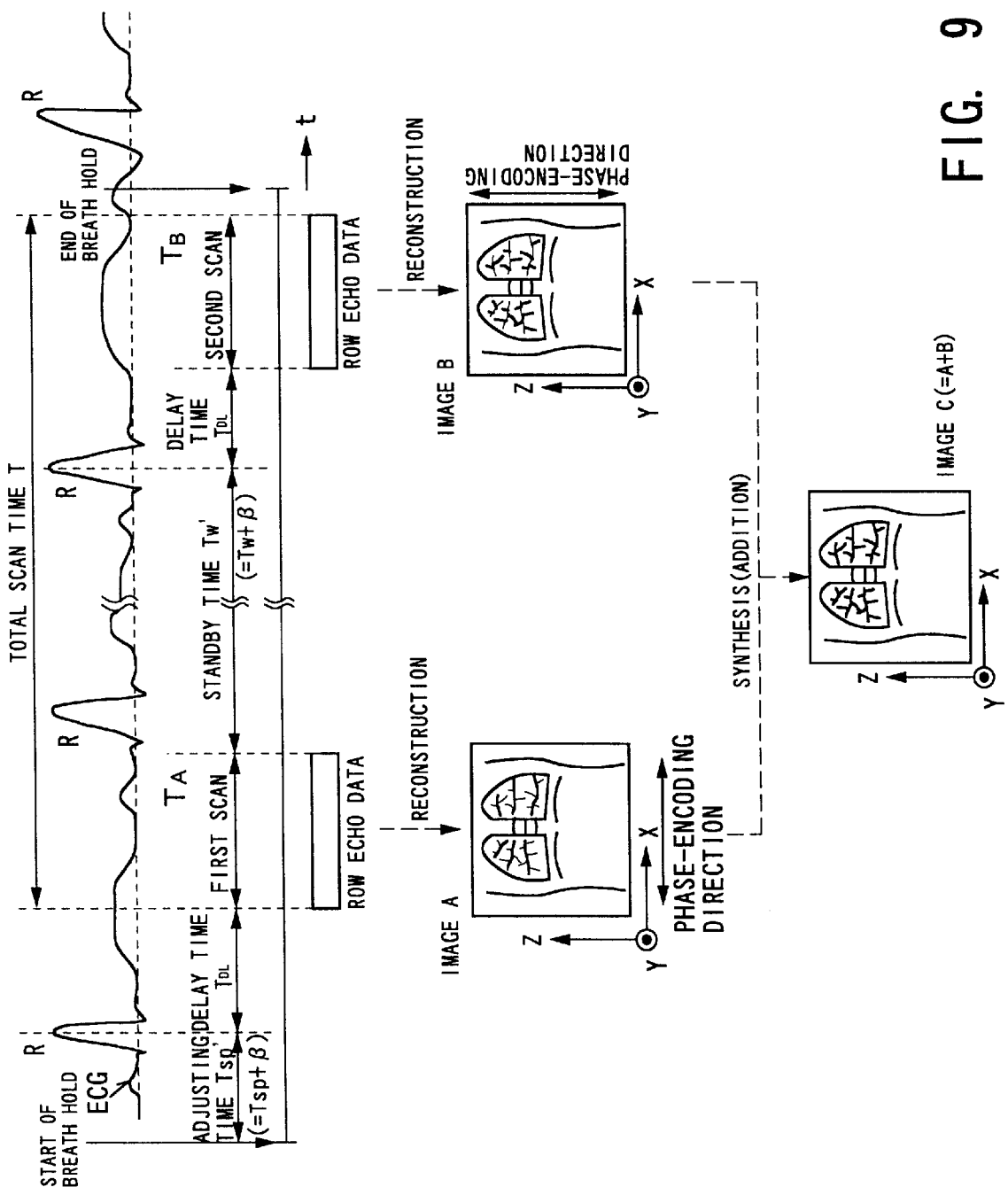
FIG. 9 is a diagram for illustratively explaining the relationship between a scanning sequence and image synthesis in the first embodiment.

As determined that a time instant when the delay time $T_{DL}$ elapsed is an optimum ECG-gating time, the host computer 6 passes control to step S28 and commands the sequencer 28 to start scanning. In response to the command, the sequencer 5 drives the transmitter 8T and gradient power supply 4 according to pulse-sequence information that has already been transmitted and stored, and executes scanning. FIG. 8 describes an example of the scanning and FIG. 9 shows the timing.

In the example of processing described in FIG. 8, the number of scans is two, and image synthesis to be described later is addition of two reconstructed images. The example of scan control will be described.

The sequencer 5 normally stands by while judging whether or not a scanning start command is sent from the host computer 6 (step S28-1). When scanning is commanded, the sequencer 5 carries out the first scan on the basis of a commanded phase-encoding direction (step S28-2). For the first scan, for example, the 2D-FSE imaging is selected, the phase-encoding direction is set to the Z-axis direction, and the readout direction (frequency-encoding direction) is set to the X-axis direction (See FIG. 9). As a result, raw echo data (k-space data) of one frame resulting from scanning of, for example, the lungs is acquired.

Spin echoes produced in the patient P by carrying out the 2D-FSE imaging are received by the RF coil 7, and sent to the receiver 8R. The receiver 8R performs various kinds of pre-processing on the spin echoes. The spin echoes are thus converted into a digital quantity. Echo data that is the digital quantity is sent to the arithmetic operation unit 10 and mapped in, for example, a two-dimensional k-space in an incorporated memory. The echo data set in the k-space is subjected to, for example, a two-dimensional Fourier transform according to proper timing and thus converted into a tomographic image in the real space. The reconstructed image data is temporarily stored in the storage unit 11, and the second scan is awaited.

After commanding the first scan, the sequencer 5 stands by while judging whether or not the scan is completed (step S28-3).

Thereafter, the sequencer 5 stands by for a given time Tw until the second scan is started (step S28-4). The standby time Tw is intended to spend time until the behavior of nuclear spins excited during the first scan returns to the steady state attained before application of excitation pulses. Owing to the standby time, the behavior of nuclear spins to be excited during the second scan will hardly be affected by excitation occurring during the first scan. This reduces influences caused by differences in the T1 relaxation times, and results in less deviations of echo data acquired during the second scan. The standby time Tw is, for example, in the order of 6 seconds. Incidentally, it is one of preferred modes of that an operator is allowed to adjust the length of the standby time Tw at the input unit 13.

When the standby tie $T_w$ has passed, the sequencer 5 reads the ECG signal and awaits an R-wave peak which will appear in the signal (Step S28-5, 6). Hence, an actual standby time $T_w'$ is composed of the designated standby time $t_w$ to which a flexible time β ranging from an elapsed time instant of $T_w$ to the R-wave appearance is added.

After the delay time $T_{DL}$ has passed, the sequencer 5 carries out the second scan for the same slice to be scanned as that scanned during the first scan (step S28-8). However, the phase-encoding direction is changed by a pre-set angle. For example, the phase-encoding direction for the second scan is set to a direction deviated by 90° from the phase-encoding direction for the first scan. Assume that the phase-encoding direction is changed to the X-axis direction and the readout direction (frequency-encoding direction) is changed to the Z-axis direction. Under these conditions for encoding, the second scan is carried out (See FIG. 9). Processing to be performed on acquired spin echoes is the same as that carried out during the first scan.

When judging that the second scan is completed, the sequencer 5 notifies the host computer 6 of the completion of the scan (steps S28-9 and S28-10).

At step S29 in FIG. 7, the host computer 6 in the standby state receives the notification saying the completion of the scan from the sequencer 5. The host computer 6 then passes control to step S30, and outputs a command of release of breath hold to the voice generator 19. The voice generator 19 then utters a voice message saying, for example, "You can breathe." toward the patient (See FIG. 9).

When the data acquisition processing is completed, the host computer 6 commands the arithmetic operation unit 10 to synthesize and display reconstructed images A and B produced by the two scans and stored temporarily in the storage unit 11 (step S31). The technique of synthesis is recognized at step S21 of inputting. Image synthesis is carried out according to the technique, whereby one synthetic image C is produced. As the technique of synthesis, in this case, addition in which two images A and B are added up pixel by pixel or maximum intensity projection in which a maximum pixel value is selected pixel by pixel from two images A and B can be adopted. In the case of addition, since any of simple addition, averaging, and weighting and addition is commanded, processing proceeds according to the commanded technique. As a results, as shown in FIG. 9, the synthetic image C of the two reconstructed images A and B is produced.

As has been described, since the ECG-gating scan time (foregoing delay time $T_{DL}$) is predetermined in an optimum over a plurality of heart beats in one time of the ECG-prep scan, the succeeding ECG-gating scan is carried out with the highest strength of echo signals from objects such as blood vessels. A situation can steadily be avoided where the echo signal strength is lowered or almost null owing to relatively lower speeds of blood flows or a flow void phenomenon. The optimized ECG-gating time helps provides MRA images steady and higher depiction performance. On one hand, using pulse sequences selected from the fast SE systems is advantageous in susceptibility and distortions in shapes.

Comparison with the conventional ECG-gating technique is as follows. in the case of the conventional one, the ECG-gating scan was carried out in synchronism with an always constant delay time from the R-waves. Appropriate selection of the delay time could avoid the scanning from being taken place in a pulsated blood flow period which occurs immediately after the R-wave appearance, and bring the scanning into a range in which the blood flow state is relatively stable. The contrast of reconstructed images may be enhanced if echo signals acquired in the stable period in the central region in the phase-encoding direction of a k-space.

However, the constant delay time is not always an optimum or appropriate amount for various objects. In particular, the ECG-gating scan for tissues or blood vessels whose the transverse relaxation time are rather short should employ more appropriate ECG-gating times depending on differences in individuals to be examined, differences in regions to be scanned, and/or types of pulse sequences used. Inappropriate ECG-gating times leads to the flow void phenomenon will no echo signal; that is, a flow of blood outputted from the cardiac muscle has not fully reached the scanned region or the flow has already passed through the region.

In short, for imaging tissues or blood vessels whose transverse relaxation times are rather short by incorporating the ECG-gating technique into the SE system sequence whose acquisition time is relatively longer, an imaging technique has totally been unknown which considers an optimized ECG-gating time for producing the highest echo signal level. In contrast, the present invention is able to improve such situation. In order to solve a situation that, because the acquisition time per one time of excitation is longer, a plurality of times of scanning with changed ECG-gating times in one heart beat are difficult as a matter of fact, the present invention employs an ECG-prep scan over a plurality of heart beats. Assigning different gating times to a plurality of R-waves permits the dynamic-time ECG-prep scan to be done in one time of imaging. As a result, a plurality of MRA images are obtained which reflect differences in the ECG-gating times, have relatively higher contrast, and avoid influence of pulsating flow occurring immediately after the R-wave appearance. An optimum or appropriate ECG-gating time can be set by using the MRA images prior to a succeeding ECG-gating imaging scan, and the above various advantages are given.

Furthermore, presetting such optimized or appropriate ECG-gating time eliminates the need for re-scanning in most cases. This leads to relieved operational load to operators, higher patient throughputs, and the like.

As mentioned above, according to this embodiment, a new synthetic image can be produced using a plurality of images represented by echo data acquired by changing phase-encoding directions. Owing to the angle control of a phase-encoding direction, the synthetic image is superb in the ability to depict blood flows each exhibiting a rather short time $T_2$.

The reason is that the pixel value blurring in a phase-encoding direction, which has been described using FIG. 6, are actively utilized, and a plurality of images which have undergone such blurring are synthesized (added up) to each other.

Figure 10A:
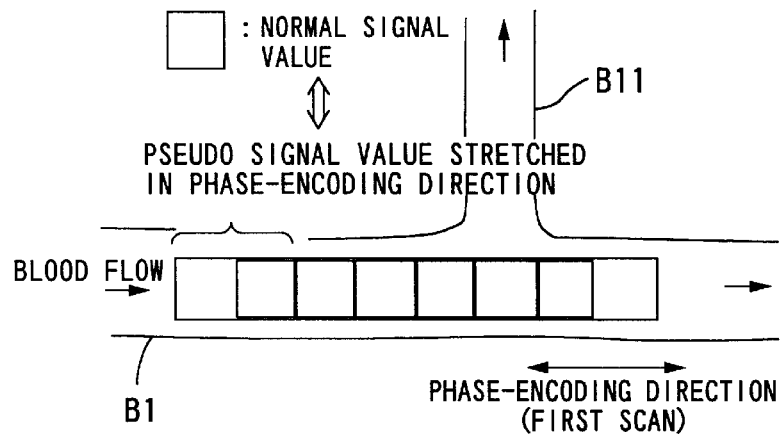
FIGS. 10A to 10C are diagrams illustratively showing examples of an image represented by signal levels that are plotted to spread along an axis of abscissae indicating a phase-encoding direction set for a single scan and an example of an image resulting from image synthesis.
Figure 10B:
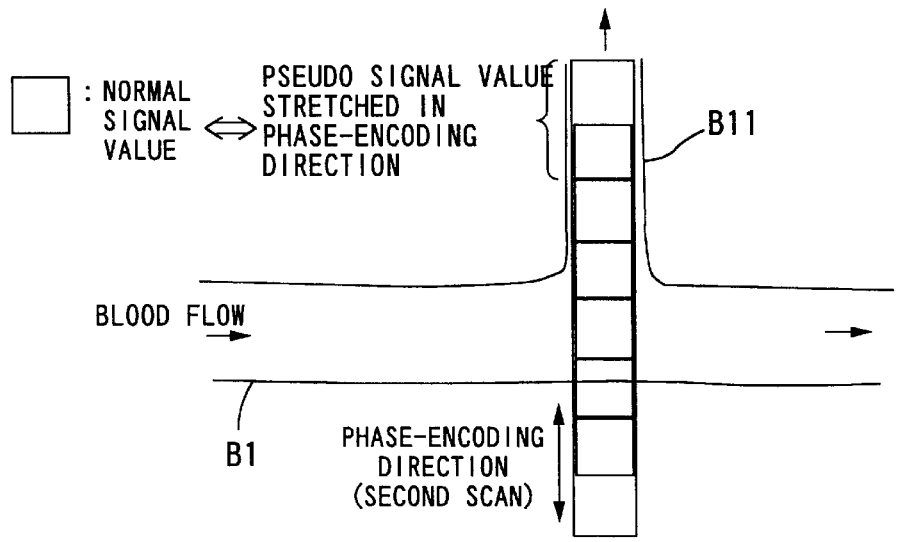
Figure 10C:
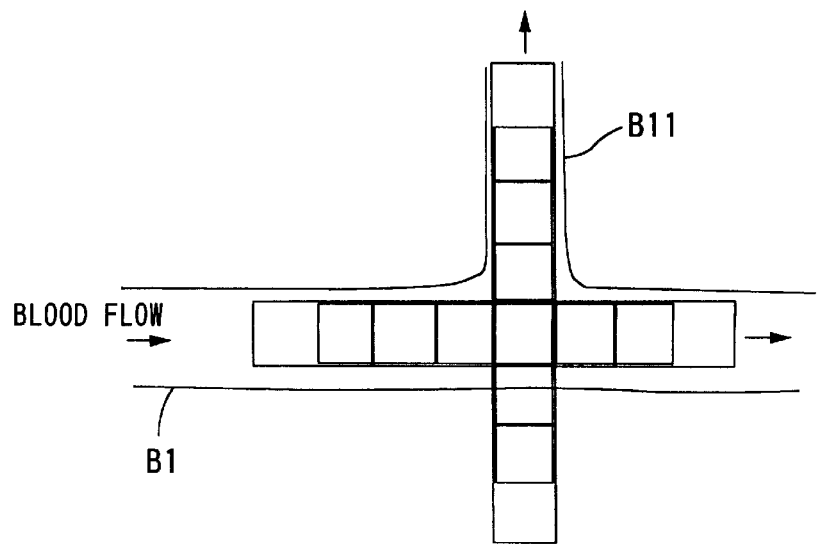

This will be described illustratively in conjunction with FIGS. 10A to 10C. As shown in FIGS. 10A to 10C, assume that a blood vessel B11 is branching out from a vessel B1 in a direction orthogonal to the vessel B1, the phase-encoding direction for the first scan is substantially consistent with the running direction of the vessel B1, and the phase-encoding direction for the second scan is substantially consistent with the running direction of the branching vessel B11. As shown in FIG. 10A, the spread of signal levels along the axis of abscissae indicating a phase-encoding direction for the first scan is equivalent to a situation in which each pseudo pixel is stretched. The vessel B1 running in a direction substantially consistent with the phase-encoding direction is blurred and thus enhanced, while the vessel B11 running in a direction orthogonal to the vessel B1 is simply blurred. However, the phase-encoding direction for the second scan is changed by 90°. This time, as shown in FIG. 10B, the vessel B1 is simply blurred, while the other vessel B11 is blurred and enhanced.

In the aforesaid embodiment in which the present invention is embodied, the reconstructed images shown in FIGS. 10A and 10B are added up (synthesized) pixel by pixel. Both the blood flows B1 and B11 running in the phase-encoding directions do not disappear but remain intact in a synthetic image as shown in FIG. 10C. Moreover, although the blood flows are blurred in the phase-encoding directions, since the two images are added up pixel by pixel during addition, the advantage of the averaging technique can be exerted. Besides, signal levels induced by a blood flow are raised in order to improve a signal-to-noise ratio. Visualization of two crossing directions is described with reference to FIGS. 10A to 10C. Even if the blood flow B1 is deviated slightly from the phase-encoding direction set for the first scan or the blood flow B11 is deviated slightly from the phase-encoding direction set for the second scan, the above advantage can be exerted. Vessels such as the pulmonary vessels running vertically and laterally can be visualized at a high signal-to-noise radio and a high contrast relative to the parenchyma with almost no loss of information concerning the running directions of the vessels. This can contribute to improvement of diagnostic performance.

In the case of the known averaging technique in which a phase-encoding direction is fixed, a signal-to-noise ratio is expected to be improved. However, when the phase-encoding direction is set to, for example, the direction shown in FIG. OA, the blood flow B11 may become indiscernible because of the blur in the phase-encoding direction or may disappear. When the phase-encoding direction is set to the direction shown in FIG. 10B, the blood flow B1 confronts with the similar problem. However, the present invention makes it possible to avoid the situation and visualize vessels exhibiting a rather short time $T_2$, such as, the pulmonary vessels and hepatic vessels without a reduction in amount of information concerning the running directions of the vessels.

In the aforesaid embodiment, all two scans are completed during one period of breath hold. Occurrence of artifacts caused by the periodic motion of the lungs or the like can be suppressed. Besides, occurrence of body-motion artifacts caused by the displacement of a patient's body occurring when the patient is asked to hold breathing a plurality of times can be minimized. Thus, a high-quality image with few artifacts can be produced.

Moreover, since a standby time during which relaxation of spins is awaited is spent between two scans, the second scan can be carried out precisely. A high-quality image can be produced.

Furthermore, although the standby time is set, since the first and second scans each require about 1.5 seconds and the standby time is about 4 seconds, the period of breath hold is about 6 seconds. The duration during which a patient must hold breathing is so short that the mental and physical loads concerning breath hold to be incurred by even a child or senile are light. This is advantageous.

(Second embodiment)

Figure 11:
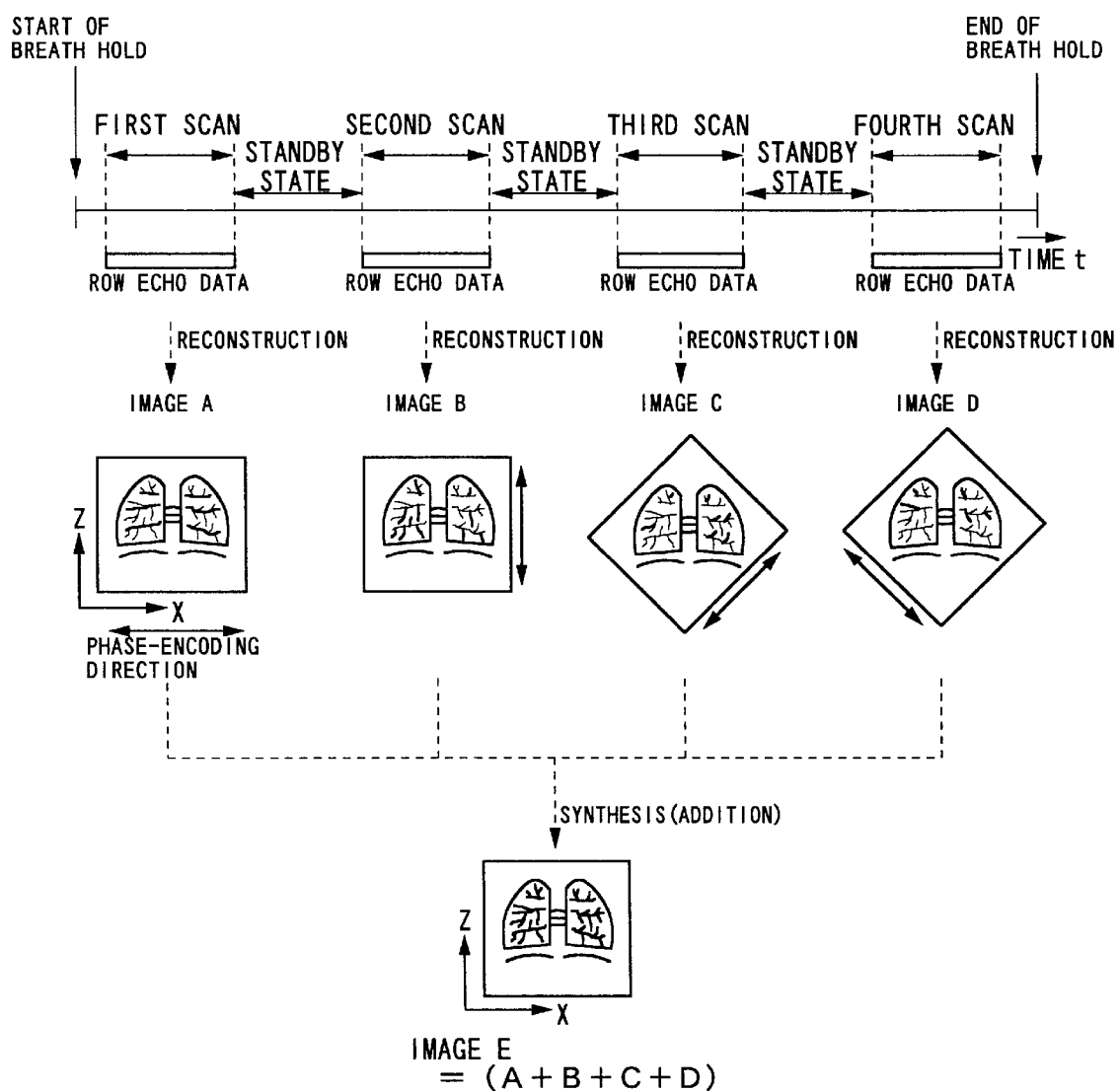
FIG. 11 is a diagram for illustratively explaining the relationship between a scanning sequence and image synthesis in a second embodiment of the present invention.

Referring to FIG. 11, a second embodiment of the present invention will now be described. The following second to fifth embodiments which exemplify further ECG-gating imaging scans using delay times $T_{DL}$ optimized through execution of the foregoing ECG-prep scan.

In the aforesaid first embodiment, a total of two scans are carried out by changing phase-encoding directions. The present invention is not limited to this mode. In an MRI system of the second embodiments, as shown in FIG. 11, a total of four scans may be carried out successively with a given standby time set between scans, while phase-encoding directions are changed for each time of scanning. MR raw echo data of four frames encoded in the different phase-encoding directions shifted by 45° is thus produced. The imaging scan for each time adopts the ECG-gating technique of which gating time is optimized or made appropriate through the pre-execution of the ECG-prep scan. The raw echo data of each frame is processed to reconstruct an image, and four reconstructed images are synthesized (by performing addition or maximum intensity projection). This procedure can also provide an MR image containing abundant information of running vessels owing to finer angle control of the phase-encoding direction.

Namely, the number of images to be added up (synthesized) according to the technique (that is, the frequency of changing phase-encoding directions), n, should be equal to or larger than 2.

(Third embodiment)

A third embodiment will now be explained in conjunction with FIGS. 12 and 13A–13B. This embodiment is concerned with three-dimensional (3D) imaging into which the ECG gating according to the present invention is applied.

In the case of three-dimensional ECG-gating imaging scan, a plurality of interleaved scans are carried out in conformity with a plurality of slice-encoding amounts with the slice direction unchanged and the phase-encoding direction and readout direction are changed for each scan.

Figure 12:
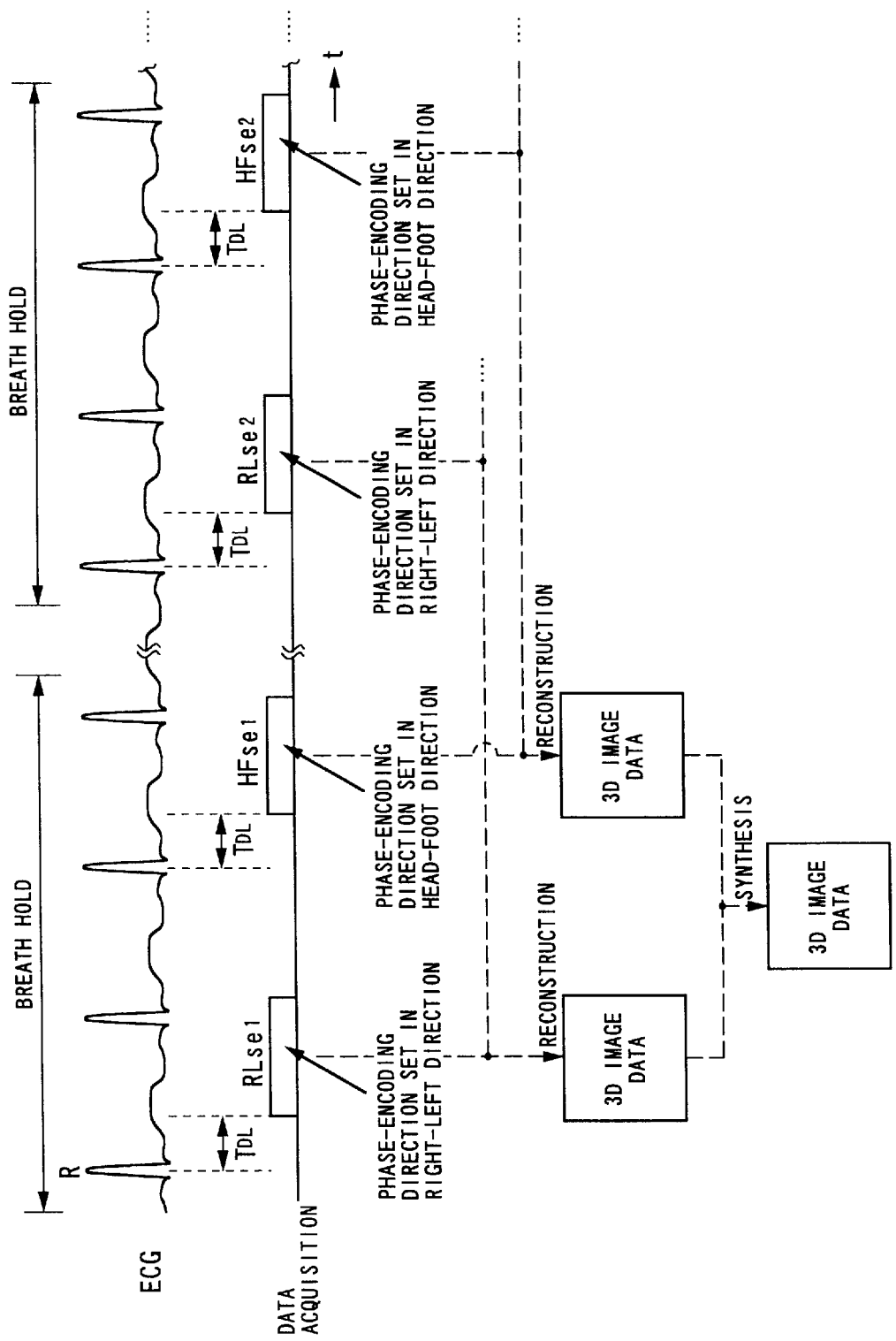
FIG. 12 is a diagram for illustratively explaining the relationship between a 3D scanning sequence and image synthesis in a third embodiment of the present invention.

Specifically, FIG. 12 shows one example of an ECG-gating imaging scan instructed by the host computer 6 and sequencer 5 and executed after the foregoing ECG-prep scan, which uses the breath hold and phase-encoding direction changing techniques. An ECG-gating time has been optimized through the ECG-prep scan.

Figures 13A, 13B:
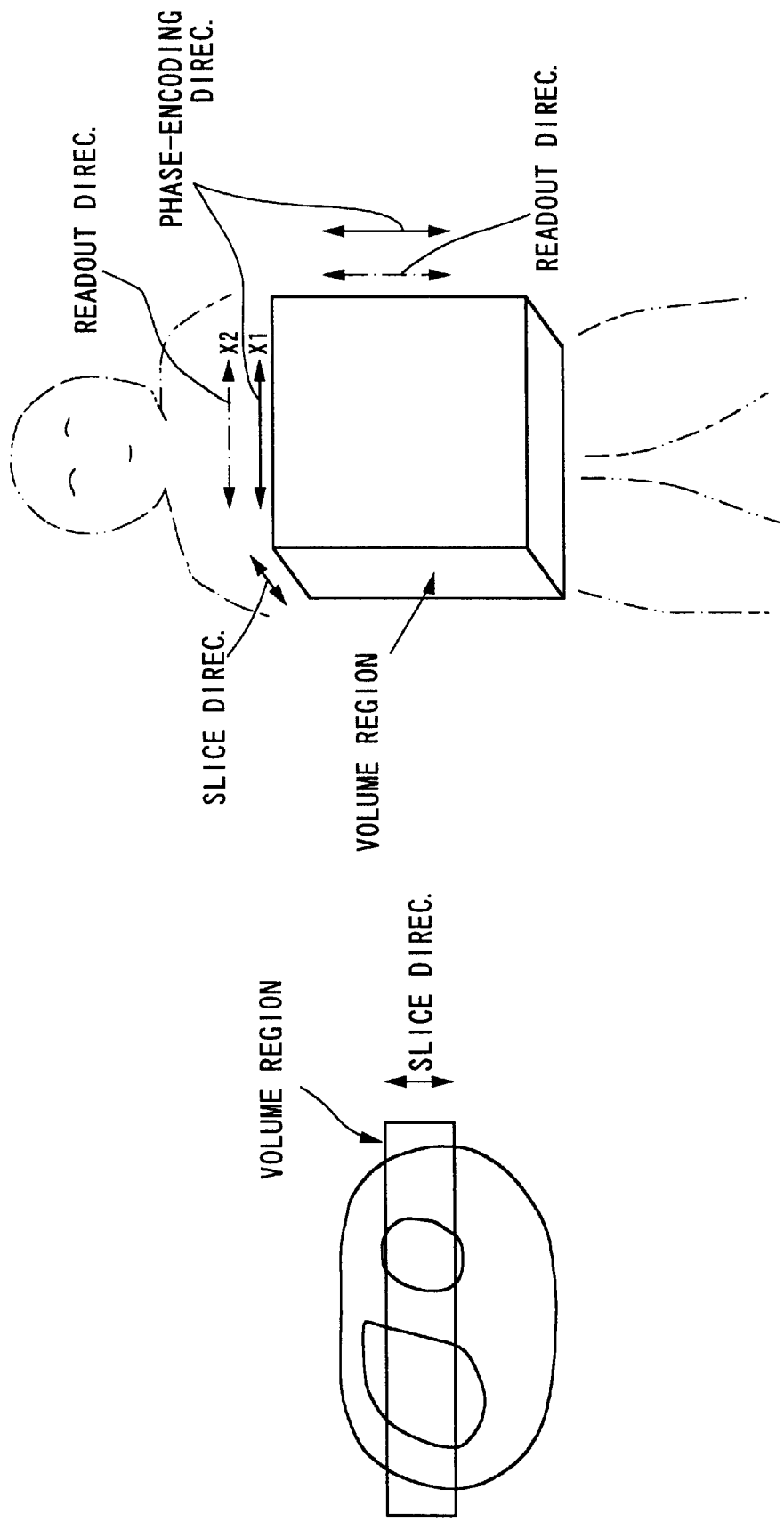
FIGS. 13A and 13B explain pictorially a three-dimensional volume to be scanned in a patient and setting gradient directions, respectively.

For example, for hypogastrium to be three-dimensionally imaged, as shown in FIGS. 13A and 13B, data acquisition of a volume is carried out 2n-times (n: integer lager than 1) based on, for example, a 3D-FASE method in the order of scans of RLse1, HFse1, RLse2, HFse2, . . . , RLsen, and Hfsen depending on each slice-encoding amount.

The scan "RLse" and "HFse" represent ECG-gating single scan for one of the slice-encoding gradient amounts providing three-dimensional raw echo data of the volume to be imaged, but those scans "RLse" and "HFse" are different in the phase-encoding direction. In the case of RLse (right-left) scanning, the phase-encoding direction is set in the right-left direction to a patient, as shown by solid arrow X1 in FIG. 13B, while in the case of HFse (head-feet) scanning, the phase-encoding direction in the head-feet direction to a patient, as shown by a dotted arrow X2 in FIG. 13B, which differs by 90 degrees from the solid arrow X1. The subscripts "se1, . . . , sen" of RL and HF represent slice-encoding whose slice-encoding gradient amounts are changed for each scan. In the exemplified sequence, the first and second ECG-gated scans are carried out for the same sliceencoding gradient amount "se1 (se2, . . . , sen)". And those two scans are repeated with changed gradient amounts of the slice-encoding. As for breath hold in this 3D imaging, as the whole scan period become a relatively longer, it is divided into several times.

One set of 3D image data are reconstructed from a group of raw echo data acquired from the scanning whose phase-encoding direction has been set in the right-left direction, while the other set of 3D image data are reconstructed form those acquired from the scanning whose phase-encoding direction has been set in the head-feet direction. Both the 3D image data are synthesized pixel by pixel, as described by addition and the like.

Thus, one 3D image is formed using changed phase-encoding directions, ECG gating with an optimized or appropriate gating time, and breath hold techniques, providing the same or similar advantages as or to those in described above, including a higher depiction performance for objects.

(Fourth embodiment)

A fourth embodiment will now be explained in conjunction with FIGS. 14 and 15. This embodiment is concerned with multi-slice imaging.

Figure 14:
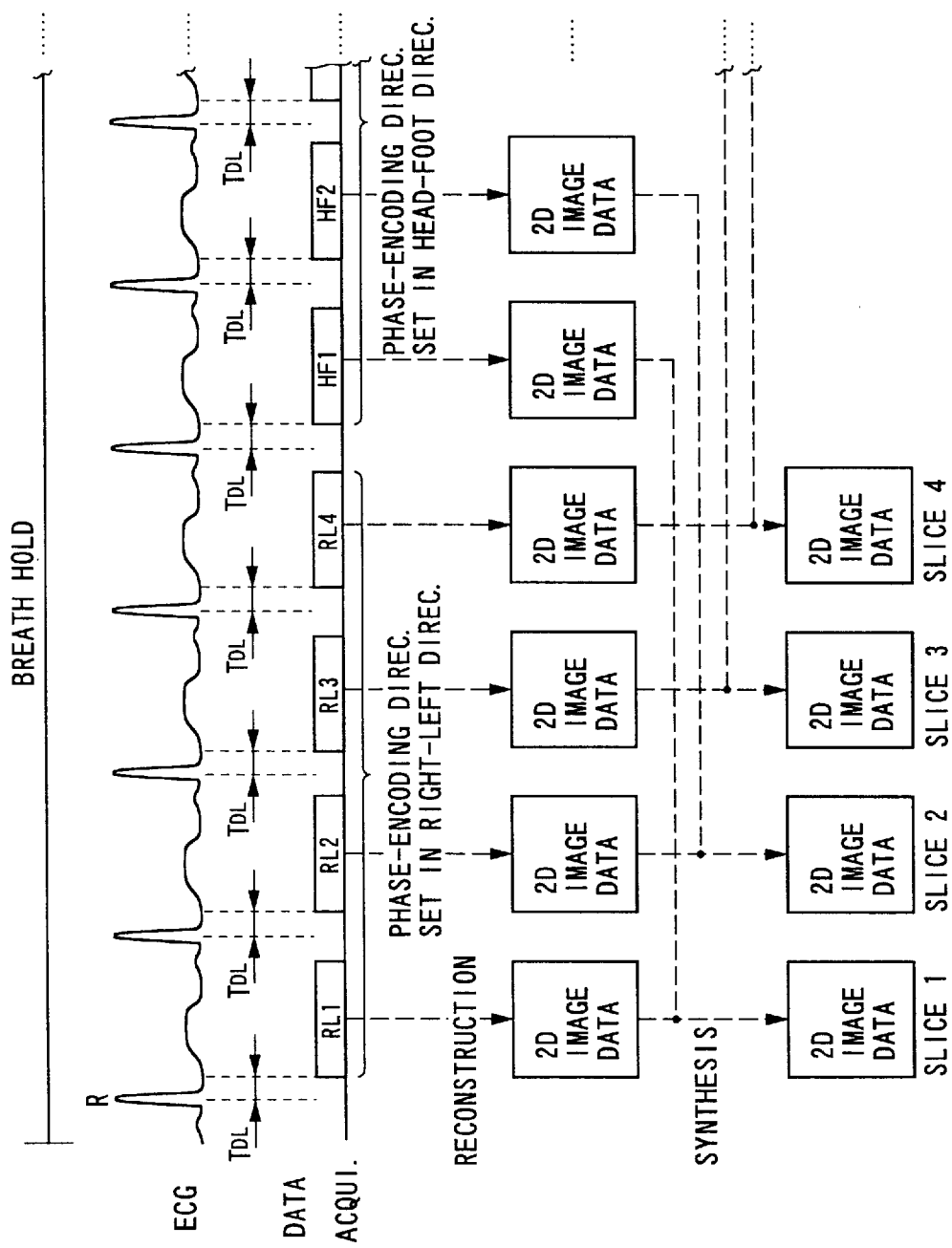
FIG. 14 is a diagram for illustratively explaining the relationship between a scanning sequence and image synthesis in a fourth embodiment of the present invention.

FIG. 14 exemplifies a data acquisition sequence instructed by the host computer 6 and sequence 5, which uses controlled setting of the phase-encoding directions, ECG-gating, and one time of breath hold. An ECG-gating time is determined on a delay time $T_{DL}$ optimized through the ECG-prep scan.

Figure 15:
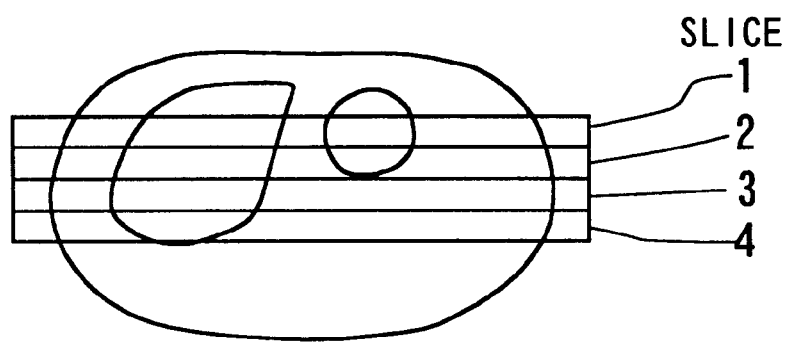
FIG. 15 explains pictorially a multi-sliced region to be scanned in a patient.

For example, for hypogastrium to be multi-slice imaged (e.g., four slices), as shown in FIG. 15, raw echo data acquisition is done based on, for example, a 2D-FASE method, in the order of RL1, RL2, RL3, RL4, HF1, HF2, HF3, and HF4 each corresponding to respective slices. The scans of RL and HF are for the phase-encoding directions set in the right-left direction and head-feet direction of a patient, respectively, and produce one frame of raw echo data being reconstructed. For each slice, two frames of 2D reconstructed image data are synthesized pixel by pixel. Thus a higher detectability of blood flows is provided thanks to optimized ECG-gating times. Of course, the other advantages concerning changed phase-encoding directions and breath hold are provided in this embodiment. Additionally any number of slices can be selected in this multi-slice imaging.

By the way, the order of the scans is not limited to the exemplified one in the above embodiment. It may be changed into any order according to the design of multi-slice imaging, such as an interleaved one like RL1, HF1, RL2, HF2, etc. In this case of the alternatively-changed interleaved order, both the scans of RL and HF for each slice can be performed in the nearest cardiac time phase, providing being less pixel-positional sifts, caused by the body motion and the like, between the two frames of image data synthesized.

Moreover, in the above third and fourth embodiments, the synthesis has been made with two sets (or frames) of reconstructed image data resultant from two phase-encoding directions mutually changed by 90 degrees. Alternatively, the synthesis can be made based on three or more sets (or frames) of reconstructed image data when the phase-encoding direction being changed in angle into three or more ways.

Of course, the imaging in the foregoing embodiments can be carried out without changing the phase-encodi ng direction. In such case, the phase-encoding direction is kept to a certain direction during a plurality of imaging scans, and resultant a plurality of sets of image data is subjected to conventional averaging to produce one set of image data. Alternatively, imaging can be done without the synthesis of image data, with only ECG-gating and/or breath hold techniques employed.

(Fifth Embodiment)

Figure 16:
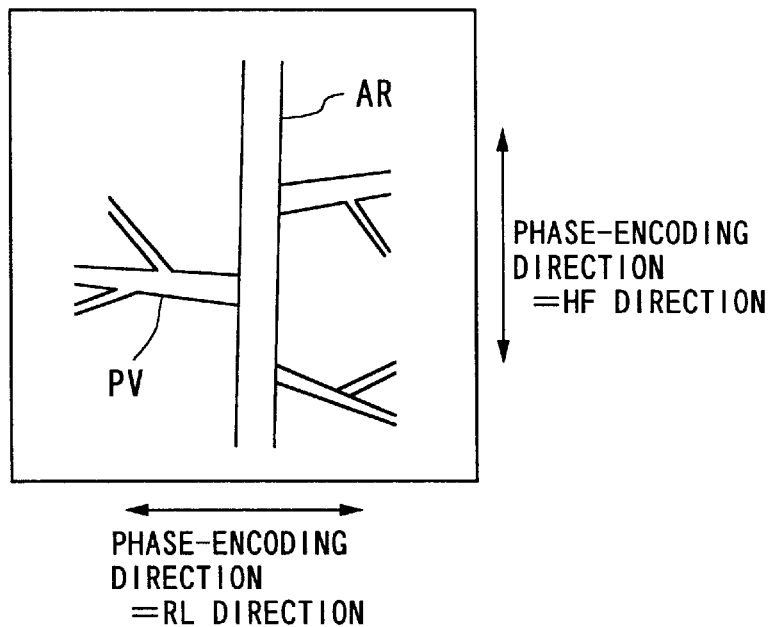
FIG. 16 explains phase-encoding directions set object by object in an ECG-prep scan in a fifth embodiment of the present invention.
Figure 17:
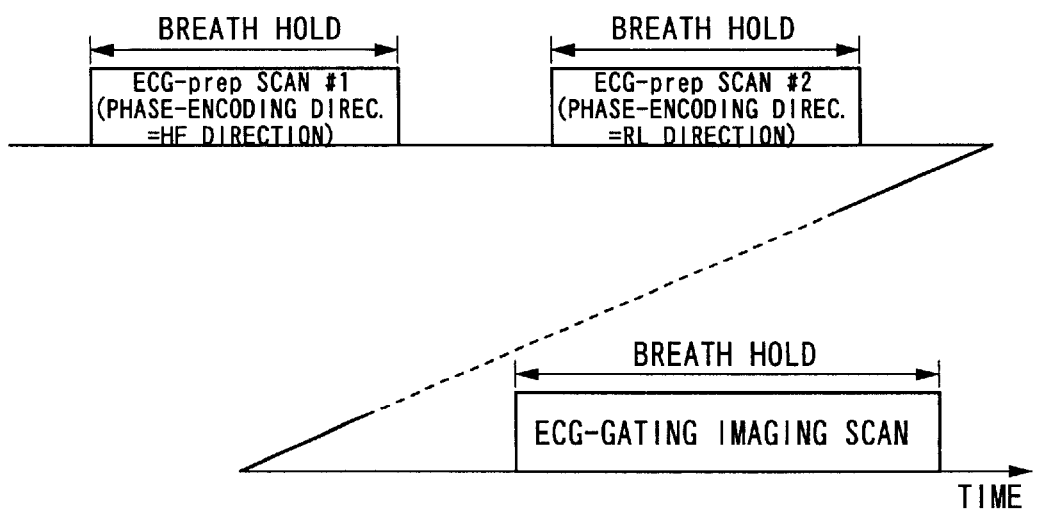
FIG. 17 pictorially shows a temporal relation between two-stage ECG-prep scans and an ECG-gating imaging scan.
Figure 18:
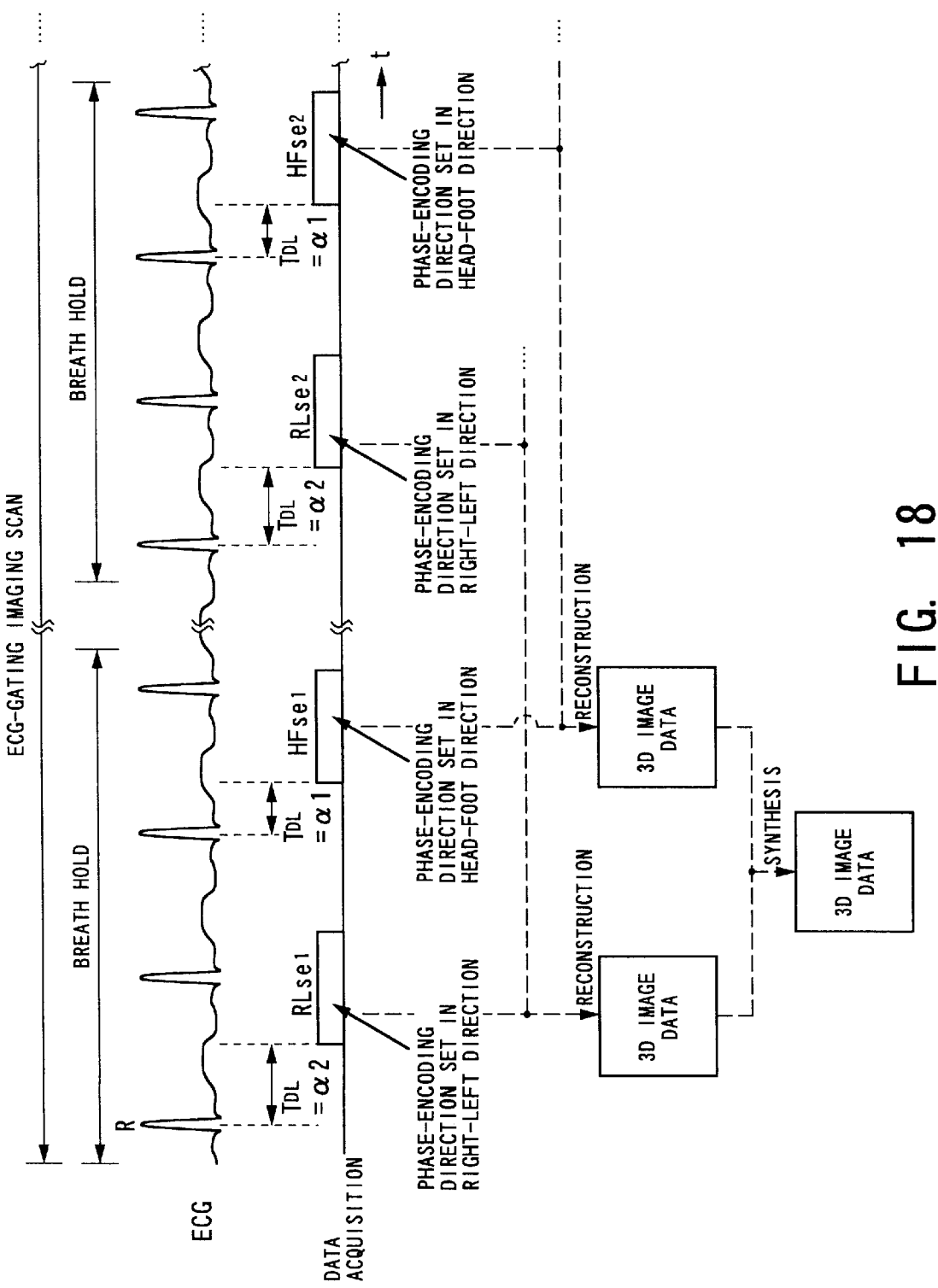
FIG. 18 is a timing chart showing an ECG-gating imaging scan which uses two types of ECG-gating times.

Referring to FIGS. 16 to 18, a fifth embodiment of the present invention will be described. This embodiment concerns a plurality of types of objects to be imaged to which the present invention is applied.

In the embodiments described so far, the ECG-gating time optimized or made appropriate through the ECG-prep SCAN is stated about a single amount (i.e., a single ECG-gating time).

Where a desired object to be imaged is one type, it is considered that a single ECG-gating time is enough. However, in cases where objects to be imaged are, as shown in FIG. 16, the aorta AR and the portal veins PV in the liver, the former runs about the body axis direction and the latter includes many portions which run along a lateral direction intersecting the body axis direction. When blood vessels differ in type from each other, it is generally assumed that their running directions also differs from each other, resulting in different optimum or appropriate ECG-gating times for those. An MRI system of the embodiment focuses on a plurality of ECG-gating times set according to differences in types and/or running directions of blood vessels and/or tissues.

As shown in FIG. 17, the host computer 6 and the sequencer 5 cooperates to perform in sequence a total of two times of ECG-prep scans, prior to an ECG-gating imaging scans. In the first ECG-prep scan #1, the foregoing scanning shown in FIGS. 3 and 4 is performed based on, as an example, a two-dimensional FASE method with the phase-encoding direction set in, for example, the head-feet (HF) direction (i.e., bodyaxis direction). The first ECG-prep scan can attach great importance to acquisition of information about the running direction of the aorta AR when referred in FIG. 16. By this, scanning is performed over a plurality of temporal phases, thereby providing an optimum or appropriate delay time $T_{DL}$=1 capable of maximizing or increasing the strength of echo signals emanated from the aorta AR.

In the second ECG-prep scan #2, the foregoing scanning shown in FIGS. 3 and 4 is performed based on a two-dimensional FASE method with the phase-encoding direction set in, for example, the right-left (RL) direction. The second ECG-prep scan can attach great importance to acquisition of information about the running direction of the portal veins PV when referred in FIG. 16. By this, scanning is performed over a plurality of temporal phases, thereby providing an optimum delay time $T_{DL}$=2 capable of maximizing or increasing the strength of echo signals emanated from the portal veins PV.

Then, using the two types of delay times $T_{DL}$=1, 2, the host computer 6 and sequencer 5 cooperatively performs an ECG-gating imaging scan based on a three-dimensional FASE method. FIG. 18 exemplifies such imaging sequence. As shown therein, for the first scan assigned to a first slice-encoding amount se1, one delay time $T_{DL}$=2 suitable for the portal veins PV is used to gate the scan start time instant. Thus, on condition that the phase-encoding direction agrees with the right-left RL direction and the slice-encoding amount equals se1, scanning is done on the 3D-FASE method. For the second scan se1, the other delay time $T_{DL}$=1 suitable for the aorta AR is used to gate the scan start time instant. Thus, on condition that the phase-encoding direction agrees with the head-feet HF direction and the slice-encoding amount equals se1, scanning is done on the 3D-FASE method.

Like the above, with changed slice-encoding amounts se, alternately repeated are one ECG-gating imaging scan with one delay time $T_{DL}$=2 and the phase-encoding direction set in the right-left RL direction and the other ECG-gating scan with the other delay time $T_{DL}$=1 and the phase-encoding direction set in the head-feet HF direction. Echo signals acquired by a series of these scans are processed in the same manner as in the first embodiment, and displayed as tomographic images.

It can therefore be summarized such that two types of ECG-gating times are obtained through performing each ECG-prep scan on a phase-encoding direction set in the direction of each blood vessel, then an ECG-gating scan is performed using the two types of ECG-gating times and the phase-encoding directions assigned tot he running directions of two types of objects to be imaged (aorta and portal veins).

Therefore, in addition to the foregoing advantage obtained by making the phase-encoding direction agree with the running directions of each object, another advantage can be provided which comes from the ECG-gating times themselves set depending on each patient, each object to be imaged, and a pulse sequence used. That is, regardless of blood flow speeds, an ECG-gating scan is performed in a state where signal values from objective blood vessels are higher, resulting in a steady capture of two types of blood vessels. Enough running information about all the objects are acquired with higher depiction performance and signal to noise ratios.

Although this embodiment has been stated about two types of blood vessels, three or more types of them can be treated by the same manner as above; namely, the ECG-prep scan is repeated by the number of the types to set each ECG-gating time suitable for each object. Moreover, the ECG-gating imaging scan using a plurality of ECG-gating times is not confined to the 3D-FASE imaging illustrated in FIG. 18; moreover, the 2D-FASE based single-slice imaging shown in FIG. 9 or 2D-FASE based multi-slice imaging shown in FIG. 14 can also be used. Concerning the pulse sequence used, the FASE sequence can be replaced by the fast SE sequence, FE-type sequence, or the like.

(Sixth Embodiment)

Referring to FIGS. 19 to 23, a sixth embodiment of the present invention will now be described.

An MRI system herein has a feature that adopts a pulse sequence referred to as a segmented FFE (abbreviated to "seg. FFE") suitable for imaging of the heart. One example is such that an ECG-prep scan is performed on a two-dimensional seg. FFE method and an ECG-gating imaging scan which follows that ECG-prep scan is performed on a three-dimensional seg. FFE method. Reducing the dimension for the ECG-prep scan decreases time required to measure an ECG-gating time.

Figure 19:
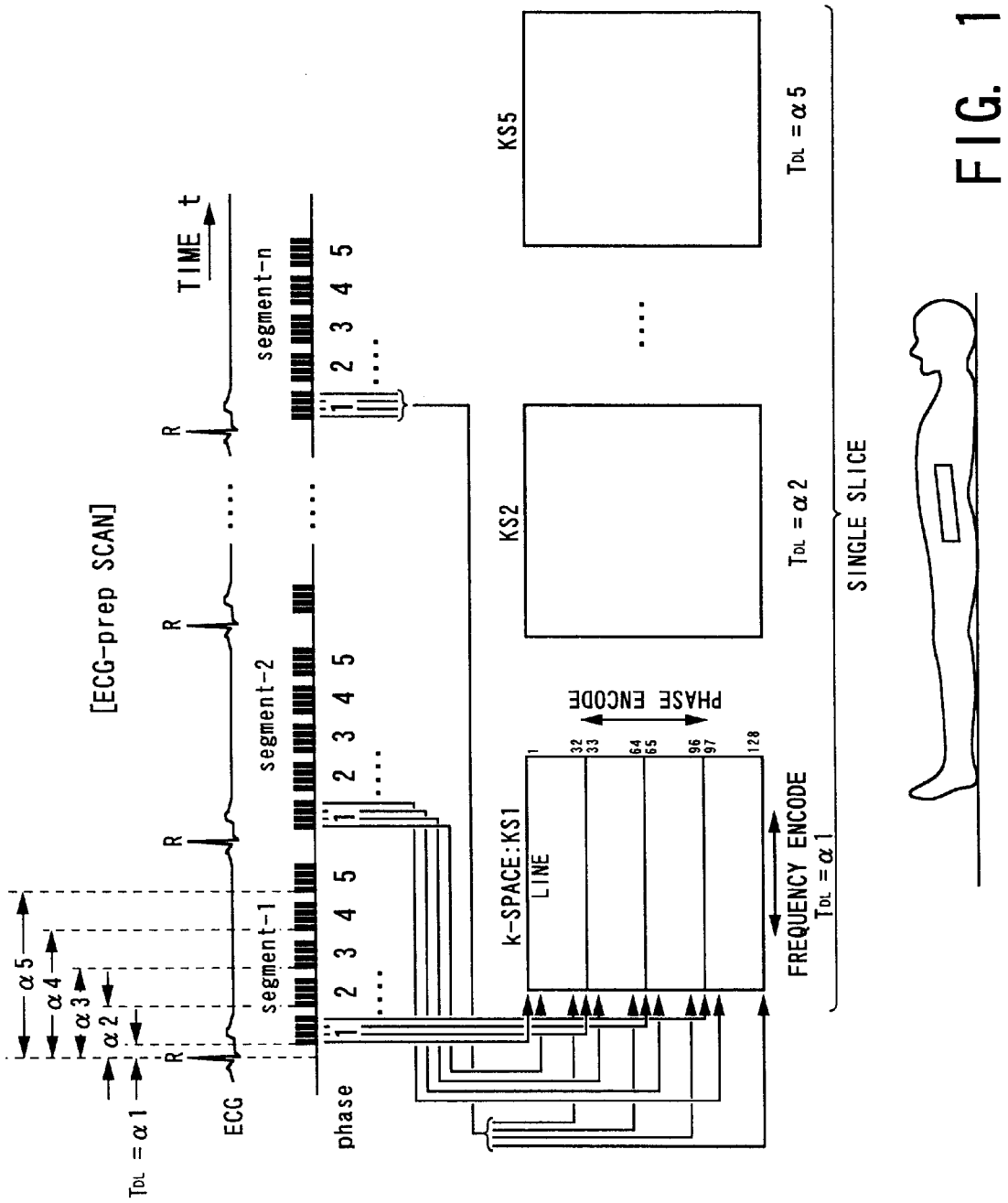
FIG. 19 is a diagram for illustratively explaining the relationship among a seg.FFE sequence, acquisition times, and echo data mapping in an ECG-prep scan executed in a sixth embodiment of the present invention.

A concrete sequence employing the seg. FFE method is exemplified in FIGS. 19 to 21. FIG. 19 outlines an ECG-prep scan, and FIG. 20 exemplifies a pulse train available for the ECG-prep scan and based on the 2D-seg. FFE method. On one hand, FIG. 21 outlines an ECG-gating imaging scan, and FIG. 22 exemplifies a pulse sequence available for ECG-gating imaging scan and based on the 3D-seg. FFE method. For both of the scans, a breath hold technique is also used, but not shown.

The ECG-prep scan employs an imaging technique referred to as "single-slice and multi-phases". The host computer 6 commands the sequencer 5 to perform the ECG-prep scan based on this technique under the 2D-seg. FFE method. By using "single-slice and multi-phases," echo data can be acquired at a time at a plurality of temporal phases for a single slice defined by a slice gradient $G_S$ amount the RF excitation signal frequency. A slice thickness is determined such that one or more objective blood vessels are contained in the slice.

Figure 20:
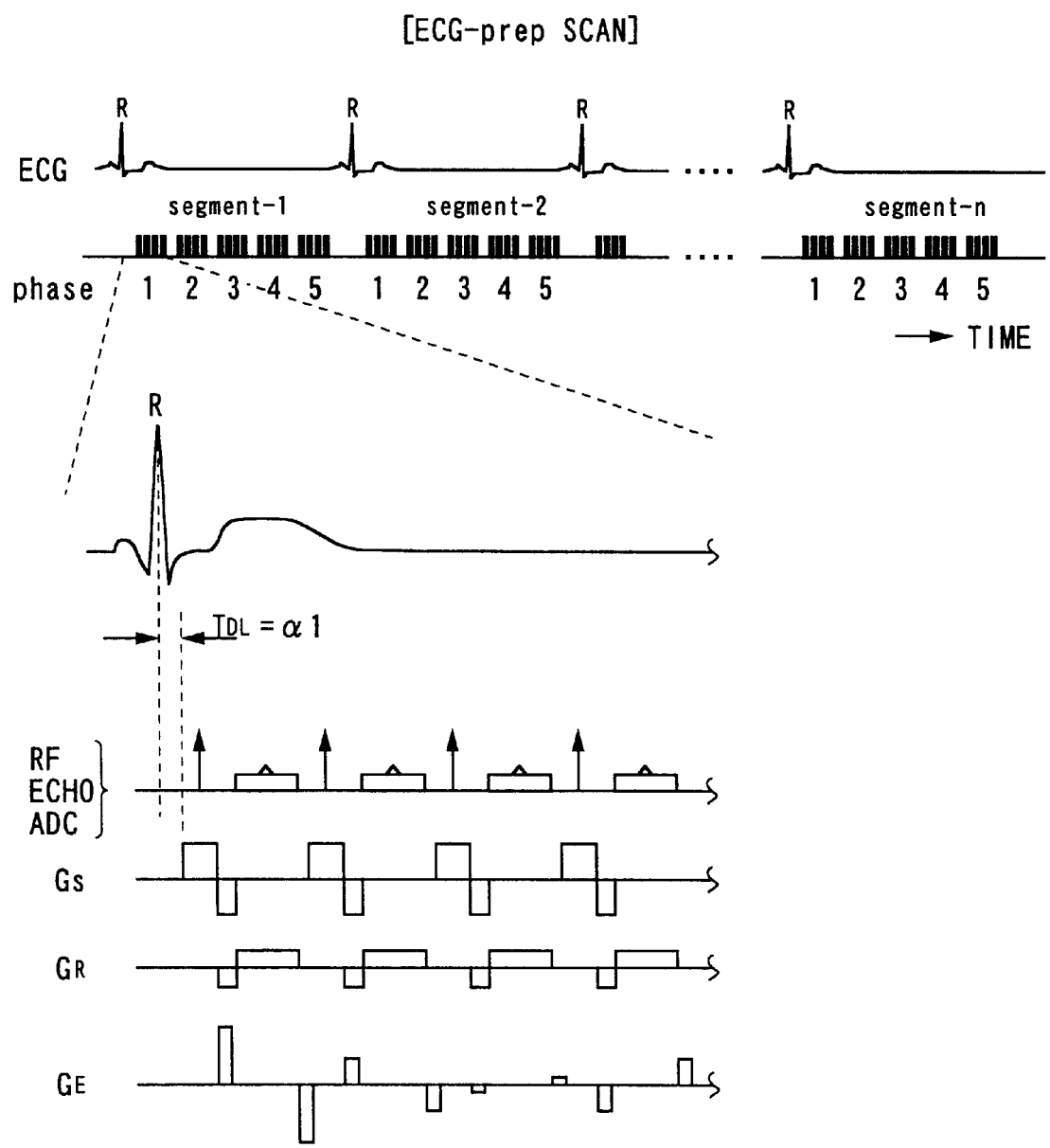
FIG. 20 is a sequence diagram for exemplifying a pulse train based on the 2D seg.FFE method.

Specifically, in an interval between R-waves, wherein a series of data called "segment", as shown a "phase 1" of a "segment 1" of FIGS. 19 and 20, a plurality of sets of RF excitation and FE method based echo acquisition (four echoes are exemplified) are repeated in turn from a time instant when a delay time $T_{DL}=1$ has elapsed after the appearance of an R-wave peak. Resultant a plurality of echo signals (herein four echo signals) are sent to the arithmetic operation unit 10 via reception processing, respectively. In the unit 10, a plurality of k-spaces (herein five pieces) are formed on condition that each space is divided into a plurality of sections (herein four sections) in the phase-encoding direction (refer to FIG. 19). Accordingly, a plurality of echo signals acquired with the "phase 1" are mapped on the first line of each section of the first k-space KS1 depending on their phase-encoded amounts.

Moreover, from another time instant when another delay time $T_{DL}=2$ (>1) has elapsed after the appearance of the foregoing R-wave peak, as shown in the next "phase 2" of the "segment 1", a plurality of sets of RF excitation and FE method based echo acquisition are repeated in sequence. Resultant echo signals are mapped on the first line of each divided section of the next k-space KS2, respectively. Likewise, for each of the remaining three delay times $T_{DL}=3$ (>2), 4(>3), and 5(>4), four echo signals are acquired and mapped on the first line of the divided sections of each of the third to fifth k-spaces KS3 to KS5, respectively. As a result, echo data are mapped on all the first lines of all the divided sections of the five k-spaces.

Further, for a "segment 2" positioned in the next R-waves interval echo acquisition and its mapping are performed in the same manner as above, except that data acquired this time are mapped on the next lines in each divided section. Hereafter, for segments 3 to 5, the same acquisition and mapping as above are performed.

When the ECG-prep scan has ended, all the five k-spaces have been mapped with echo data. The arithmetic operation unit 10 then performs a two-dimensional transform with each of the five k-space data so as to reconstruct them into five real-space images. Accordingly, five preparing images having the temporal phases defined by the delay times $T_{DL}=1$ to 5, respectively, can be obtained at a time. An operator observes visually the five preparing images, and selects a desired image where regions to be imaged are most clearly shown, which corresponds to an optimum or appropriate delay time $T_{DL}$.

Figure 21:
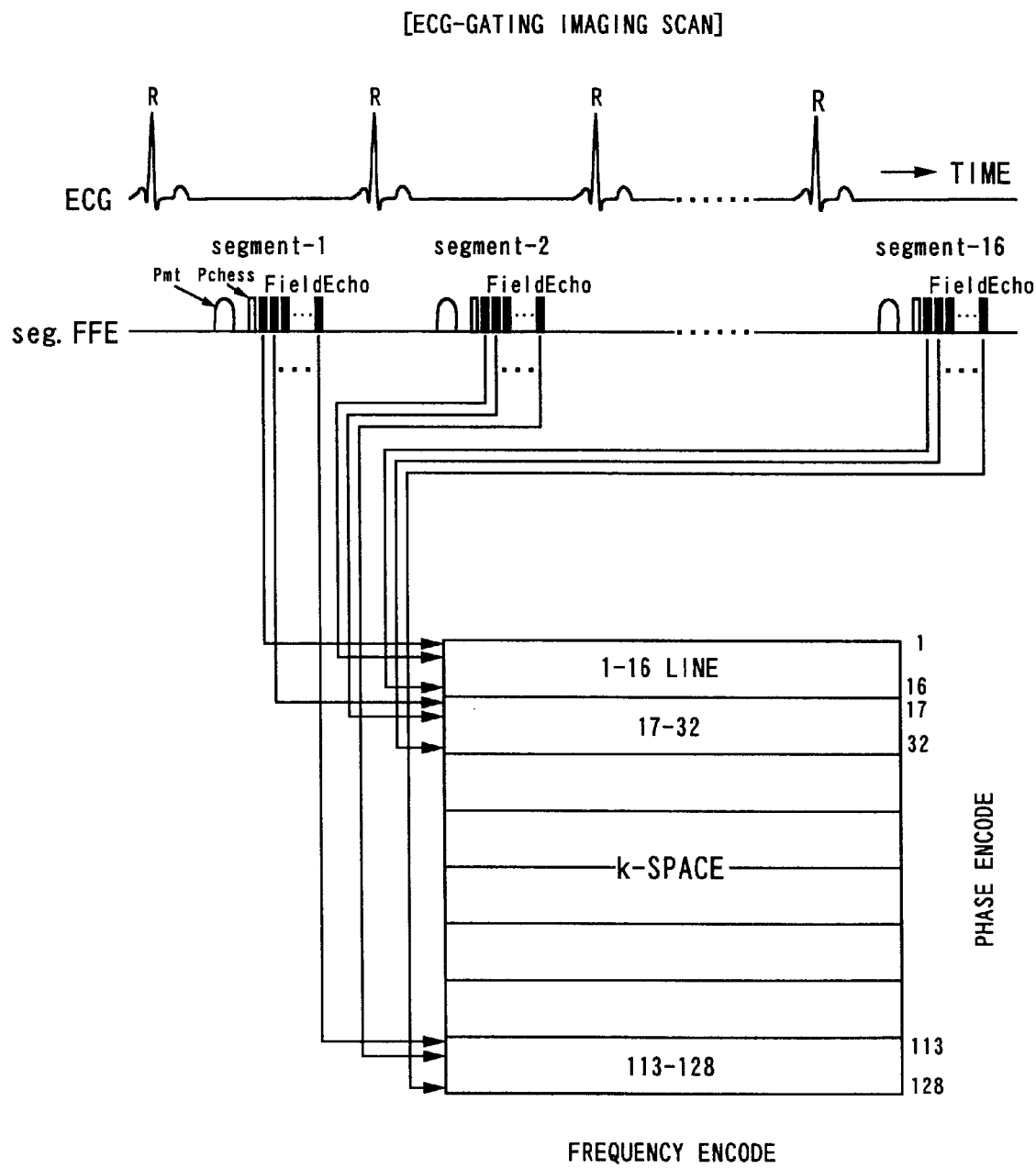
FIG. 21 is a diagram for illustratively explaining the relationship among a seg.FFE sequence, acquisition times, and echo data mapping in an ECG-gating imaging scan executed in the sixth embodiment.
Figure 22:
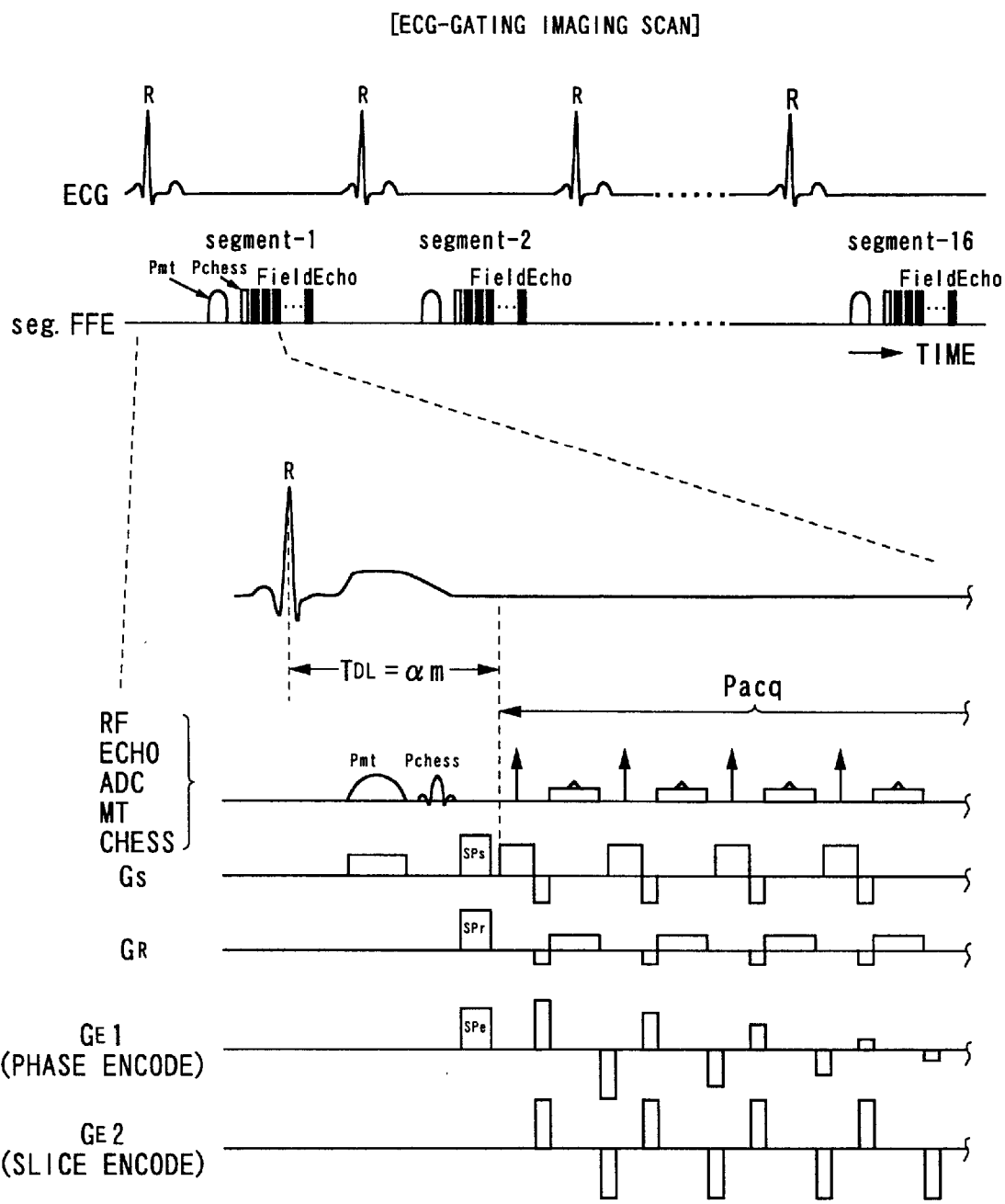
FIG. 22 is a sequence diagram for exemplifying a pulse train based on the 3D seg.FFE method.

As the next step, the host computer 6 instructs the sequencer 5 to execute an ECG-gating imaging scan in compliance with a three-dimensional seg. FFE method, as shown in FIGS. 21 and 22. An optimum or appropriate delay time $T_{DL}=m$ used in the imaging scan is an amount determined through the above ECG-prep scan.

A pulse train for each segment used in the imaging scan includes an MT (magnetization transfer) pulse Pmt first applied and providing spins MT effects, a chemical selective pulse $P_{chess}$ next applied and suppressing signals from fat components, and spoiler pulses $SP_s$, $SP_r$ and $SP_e$ next applied and dephasing spins in each gradient direction, which compose a preparing pulse train. A data acquisition pulse train $P_{acq}$ for acquiring field echoes follows the preparing pulse train. Because the imaging scan is based on a three-dimensional scan, a slice-encoding gradient $G_{E2}$ is applied besides a phase-encoding gradient $G_{G1}$.

The segmented plural echo signals are mapped in a three-dimensional k-space formed in the arithmetic operation unit 10 depending on the slice- and phase-encoding gradient amounts. The mapped data then undergoes a 3D Fourier transform to be reconstructed into real-space image data, and transformed into 2D image data by, for example, MIP processing.

Though the present embodiment does not use a scanning method by which a plurality of scans are made with spatial-changed phase-encoding directions, as stated before, the heart can steadily be imaged thanks to the seg.FFE method. Particularly, presetting an optimum or appropriate ECG-gating time permits faster blood flows associated with the heart to be captured in a steady fashion.

As described, the ECG-gating time is measured by the "single-slice and multi-phases" mode, which can provide at a time a plurality of preparing images with different temporal phases through one time of ECG-prep scan. It is therefore unnecessary to perform the ECG-prep scan a plurality of times, reducing the entire imaging time and increasing the patient throughput.

Figure 23:
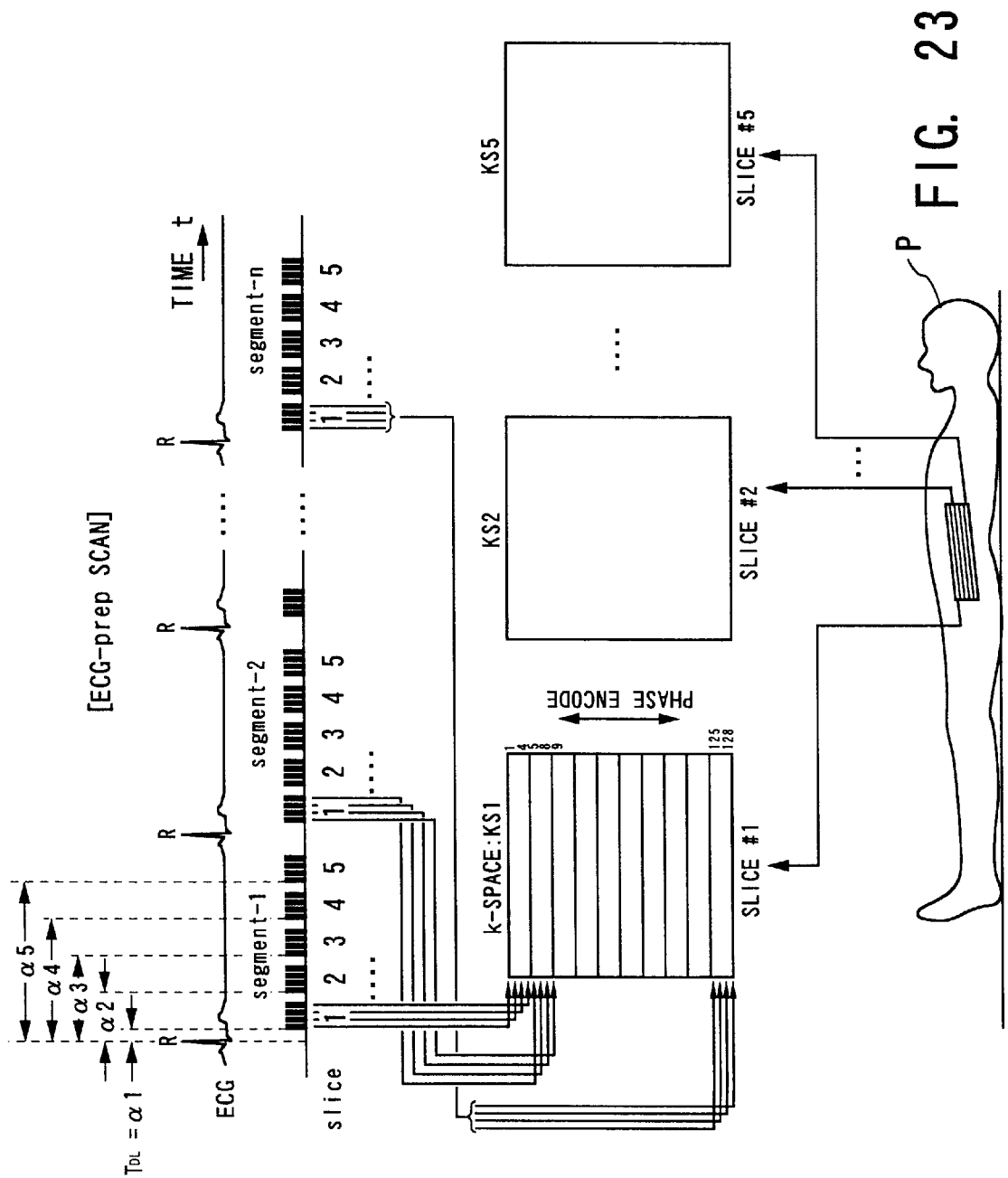
FIG. 23 is a diagram for illustratively explaining the relationship among a seg.FFE sequence, acquisition times, and echo data mapping in an ECG-prep scan executed in an alternative example of the sixth embodiment.

On one hand, the ECG-prep scan based on the seg.FFE method is not restricted to the above "single-slice and multi-phases" mode; alternatively, for example, as shown in FIG. 23, another "multi-slices and single phase" mode may be used as a simplified manner. (The "single phase" herein means assigning one phase to each slice.) as illustrated in FIG. 23, a k-space KS1 for one slice #1 is loaded with a plurality of echo signals acquired from a "slice 1" of each segment. Also, another k-space KS2 for another slice #2 is loaded with a plurality of echo signals acquired from a "slice 2" of each segment. Likewise, the remaining k-spaces KS3 to KS5 for other slices #3 to #5 are filled with a plurality of echo signals acquired from each of "slices 3 to 5" of each segment, respectively. Such acquisition under one time of the seg.FFE method provides at a time a plurality of tomographic images of slices #1 to #5 of which acquisition times are differently determined by delay times $T_{DL}=1$ to 5.

Since a plurality of slices #1 to #5 are spatially close or contiguous to each other, it is frequently true that all the slices #1 to #5 be regarded as a single slice (image) which reflects almost exactly an ECG-gating timing toward a region to be imaged. If such condition is met, a plurality of images are treated as a single image as it is, and an optimum or appropriate delay time is set using these images. Where this simplified "multi-slices and single phase" mode is usable, the imaging on this mode is more advantageous in SAR (EF exposure) than the foregoing "single-slice and multi-phases".

Alternatively, the above technique used with the seg.FFE method can be applied to an EPI method; namely, an ECG-prep scan is performed on a 2D-EPI method to optimize a delay time or make it more appropriate, and an ECG-gating imaging scan is performed on a 3D-EPI method in which the optimized or appropriate delay time is incorporated.

(Seventh Embodiment)

Figure 24:
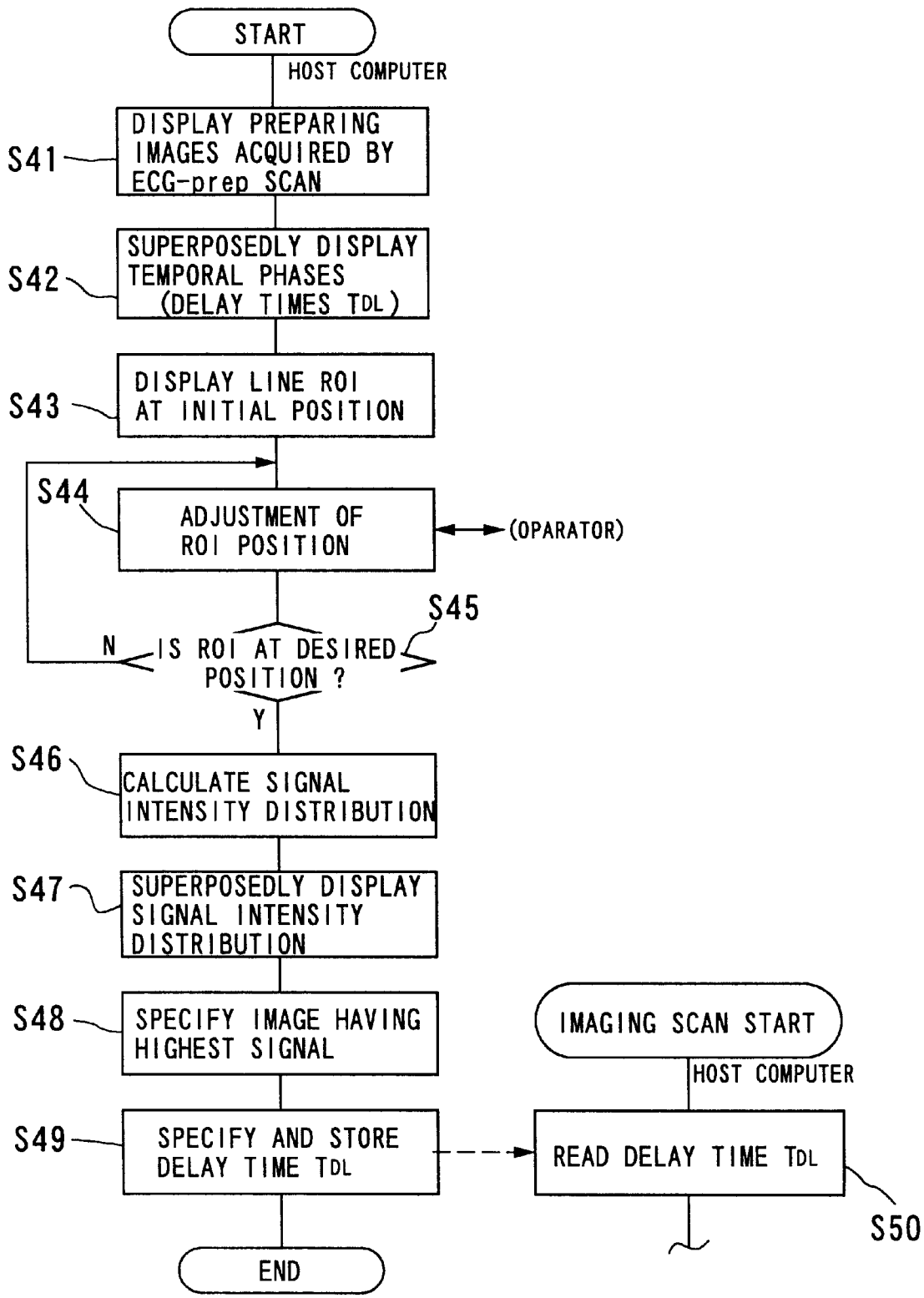
FIG. 24 outlines a flowchart for showing processing automatically determining an ECG-gating time in a seventh embodiment of the present invention.
Figure 25:
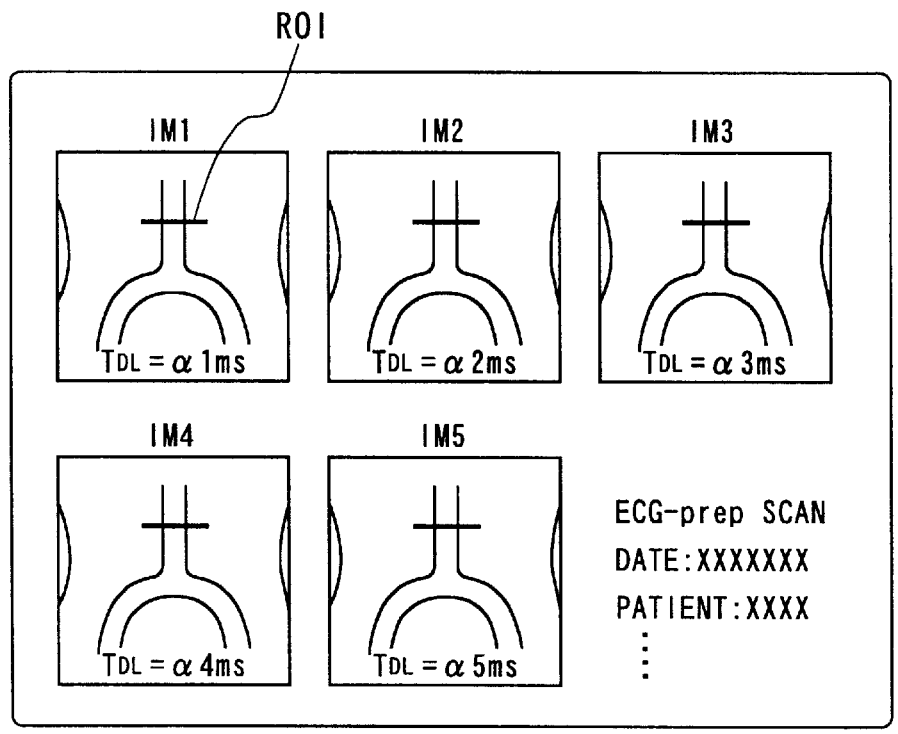
FIG. 25 is an explanatory diagram showing preparing images produced at one step in determining an optimum ECG-gating time.
Figure 26:
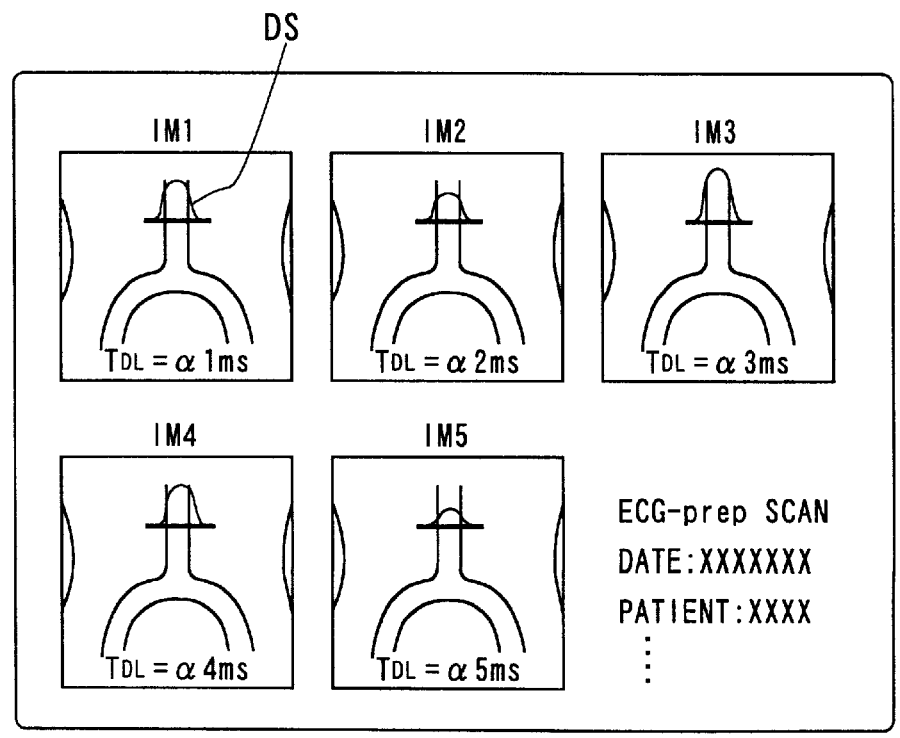
FIG. 26 is an explanatory diagram showing preparing images produced at another step in determining an optimum ECG-gating time.

Referring to FIGS. 24 to 26, a seventh embodiment of the present invention will be described.

An MRI system herein practiced is characterized by labor-saving operation required to not only select or determine an optimum or appropriate delay time using image data of different temporal phases acquired with an ECG-prep scan but also reflect the optimum or appropriate delay time in an ECG-gating imaging scan.

To realize this, the host computer is responsible for a series of processes shown in FIG. 24. As in the foregoing embodiments, after preparing images with a plurality of temporal phases have been obtained through an ECG-prep scan, the host computer 6 goes on to the processes in FIG. 24. According to this processing, a plurality of preparing images IM1 to IM5 are displayed as pictorially shown in FIG. 25 (Step S41). Each value of delay times $T_{DL}$ are superposedly displayed thereon (Step S42).

After this display, as shown in FIG. 25, a linear (line-like) ROI is displayed at its predetermined initial position on each preparing image IM1 (to IM5) in a superposition fashion (Step S43). Then a signal given by an operator via the input device 13 is read, the ROI position is adjusted in agreement with the operator's input, and whether the present ROI position is desired one or not is determined (Steps S44 and S45). This manner makes it possible to interactively place the linear ROI on a desired position of, for example, a desired blood vessel.

Then, for pixels residing on the placed linear ROI in each preparing image IM, a distribution DS of signal intensities is calculated and the distribution DS is superposed on each image (Step S46 and S47), as exemplified in FIG. 26.

An image which represents for example, the highest intensity in all the signal intensity distributions DS is determined (Step S48). The highest value is just one index for determining a certain image whose signal intensities at the ROI position are the highest, and any other indexes may be used. Additionally, the linear ROI may be replaced by a rectangular ROI to use histograms to determine an appropriate or optimum gating time, instead of the signal intensity distribution.

Then, a temporal phase (delay time $T_{DL}$) of the determined image is designated as an optimum or appropriate ECG-gating time, and temporarily stored in an internal memory (Step S49). The stored delay tie $T_{DL}$ is automatically read by the host computer 6 at Step S50, which corresponds to Step S20 in FIG. 7. This automatic reading of the optimum or appropriate delay time determined composes one feature of the invention, which automatically (not by hand) reflects the results of a preparing scan in an imaging scan.

Accordingly, labor necessary for distinguishing preparing images from each other in determining an ECG-gating time is remarkably saved and accuracy in its determination is increased, providing a more exact ECG-gating time. This leads to a higher performance to capture blood flows. Additionally, labor necessary for reflecting the preparing scan results in a succeeding imaging scan is also saved to a greater extent, resulting in an improved efficiency in operator's operation.

In the present invention, how to determine an ECG-gating time is not confined to the manner described in the seventh embodiment. For example, two or more preparing images are selected from a plurality of preparing images acquired, and calculation based on known techniques, such as curve fitting, is applied to two or more delay times assigned separately to their preparing images, so that an optimum or appropriate gating time is obtained. Furthermore, instead of displaying preparing images, a gating time can be determined by automatically calculating signal intensity distributions or histograms from preparing image data and making the results undergo a given algorithm to determine the gating time.

Furthermore, the foregoing various embodiments are concerned with MRA. An object to be imaged of a patient is not limited to vessels but may be any entity such as a tissue running like a fiber. As long as an entity is composed of spins whose time $T_2$ is rather short, the scanning and image processing in accordance with the present invention can preferably be implemented in imaging the entity.

Although the description above contains many specificities, these should not be construed as limiting the scope of the invention but as merely providing illustrations of some of the presently preferred embodiments of this invention. Thus the scope of this invention should be determined by the appended claims and their equivalents.

What is claimed is:

1. A magnetic resonance imaging system for performing an imaging MR (magnetic resonance) scan based on a cardiac synchronization technique with an appropriate region of an object to be imaged, said system comprising:

means for acquiring a pulsatile signal indicative of cardiac temporal phases of the object;

means for performing a plurality of times a preparatory MR scan with the region at each of different synchronizing time instants measured from a predetermined reference point repeatedly appearing in the pulsatile signal, wherein an MR signal is acquired by each scan;

means for producing a plurality of preparatory images, each assigned respectively to one of the corresponding plurality of different synchronizing time instants from the acquired MR signal; and means for using information about the plurality of preparatory images in the imaging MR scan.

2. The system of claim 1, wherein the information using means has;

means for displaying the plurality of preparatory images, and means for manually using information about a synchronizing time instant in the imaging MR scan, the synchronizing time instant being for the cardiac synchronization technique and being determined by observing the plurality of preparatory images displayed.

3. The system of claim 1, wherein the information reflecting means has;

means for displaying the plurality of preparatory images, means for manually pointing to a desired position in each of the plurality of preparatory images, means for automatically calculating information about strengths of image data at the pointed position in each of the plurality of preparatory images, means for automatically selecting an appropriate one from the plurality of preparatory images on the basis of results calculated by the calculating means, and means for automatically using, as the synchronizing time instant for the cardiac synchronization technique, the synchronizing time instant assigned to the selected preparatory image in the imaging MR scan.

4. A magnetic resonance imaging system comprising;
means for acquiring a pulsatile signal indicative of cardiac temporal phases of a patient;
means for performing a plurality of times a preparatory MR (magnetic resonance) scan with a region including an object to be imaged of the patient at each of different synchronizing time instants determined based on a predetermined reference point repeatedly appearing in the pulsatile signal, wherein MR signals are acquired by each scan;
means for producing a plurality of preparatory images using the acquired MR signals;
means for determining an appropriate synchronizing time instant for a cardiac synchronization technique on the basis of the plurality of preparatory images; and
means for performing an imaging MR scan with the region of the patient in synchronization with the determined appropriate synchronization time instant.

5. The system of claim 4, wherein the pulsatile signal indicative of the cardiac temporal phases is an ECG (electrocardiogram) signal generated by the patient and the cardiac synchronization technique is an ECG-gating technique.

6. The system of claim 5, wherein the means for performing preparation scans has:
means for changing a delay time from an R-wave peak, employed as the reference point, of the ECG signal into a plurality of delay times, and
means for starting the preparatory MR scan at each of the synchronizing temporal instants when each of the changed delay times has elapsed.

7. The system of claim 6, wherein the object to be imaged includes one of (i) a tissue and (ii) blood vessel of the patient having a shorter spin-spin relaxation time of nuclear spins than at least some other patient structures giving off MR signals.

8. The system of claim 6, wherein both of the preparatory MR scans and the imaging MR scan are based on the same type of pulse sequences.

9. The system of claim 8, wherein the pulse sequence includes one of (i) a fast SE (spin echo) method and (ii) a method of the fast SE method type.

10. The system of claim 9, wherein the pulse sequence has a scan time of not less than approximately 200 msec per one time of RF excitation.

11. The system of claim 10, wherein:
the pulse sequence depends on a Fourier transform for reconstructing MR signals mapped in a frequency space into a real space image, the frequency space being divided into a plurality of blocks in a phase-encoding direction thereof.

12. The system of claim 8, wherein the pulse sequence comprises a segmented fast FE (gradient field echo) pulse sequence.

13. The system of claim 12, wherein the segmented fast FE pulse sequence has a pulse train to acquire a plurality of echo signals at each of a plurality of different time instants residing between R-waves and to map the echo signal acquired at the same time instant in each of a plurality of two-dimensional frequency spaces set to a single slice passing through the region of the patient.

14. The system of claim 8, wherein the pulse sequence comprises an EPI (echo planar imaging) pulse sequence.

15. The system of claim 8, wherein the pulse sequence used in the preparatory MR scan is for a two-dimensional scan and the pulse sequence used in the imaging MR scan is for a three-dimensional scan.

16. The system of claim 4, wherein:
the object comprises a plurality of types of objects;
the preparatory MR scan performing means has means for performing the preparatory MR scan object-by-object in a phase-encoding direction in agreement with each of the plurality of types of objects;
the preparatory image producing means is constructed to produce the plurality of preparatory images object-by-object from the MR signals acquired through the preparatory MR scan;
the appropriate synchronizing time instant determining means is constructed to determine the appropriate synchronizing time instant object by-object on the basis of the plurality of preparatory images; and
the imaging MR scan performing means has means for performing the imaging MR scan object-by-object not only in synchronization with the appropriate synchronizing time instant determined for every object but also in a phase-encoding direction in agreement with a running direction of each of the plurality of objects.

17. The system of claim 16, wherein the plurality of types of objects comprises a plurality of types of blood vessels spatially running along different directions in the region.

18. The system of claim 17, wherein the imaging MR scan performing means has;
means for acquiring the echo signal object-by-object and
means for producing image data associated with the region from the echo signal acquired for each object.

19. The system of claim 18, wherein the image data producing means has:
means for reconstructing the echo signal into real space data object-by-object, and
means for synthesizing the reconstructed data of each object pixel-by-pixel.

20. The system of claim 4, wherein:
the appropriate synchronizing time instant determining means has an interface means for representing the plurality of preparatory images to an operator as well as accepting a region of interest that the operator desires, and
means for setting the appropriate synchronizing time instant using data associated with strength of the echo signal acquired from the region of interest.

21. The system of claim 20, wherein the appropriate synchronizing time instant determining means further has:
means for automatically using the set appropriate synchronizing time instant in a sequence used in the imaging MR scan.

22. The system of claim 20, wherein:
the interface means has means for displaying superimposed information indicative of each of the plurality of different time instants on each of the plurality of preparatory images.

23. The system of claim 20, wherein:
the interface means has a ROI (region of interest) inputting means used by the operator to input the region of interest with a ROI; and
the setting means has means for calculating a signal strength distribution from pixel values corresponding in position to the ROI and means for obtaining the appropriate synchronizing time instant from the signal strength distribution with a given algorithm.

24. The system of claim 4, wherein the preparatory MR scan performing means includes means for making a phase-encoding direction for the preparatory MR scan agree with a running direction of the object.

25. The system of claim 4, further comprising.

means for instructing the patient to execute a breath hold for a period during which the preparatory MR scan is performed.

26. A method of magnetic resonance imaging in which a pulsatile signal indicative of a cardiac temporal phase of a patient is acquired, said method comprising the steps of:

performing a preparatory MR (magnetic resonance) scan with a region containing an object to be imaged of the patient to start at each of a plurality of time instants when a plurality of different delay times elapse respectively from a predetermined reference point included and repeated in the pulsatile signal, thus a plurality of preparatory images being produced;

determining an appropriate synchronizing time instant for electrocardiogram (ECG) gating using the plurality of preparatory images; and subsequently performing an imaging MR scan with the region of the patient in synchronization with the appropriate synchronizing time instant.

27. A magnetic resonance imaging method for performing an imaging MR (magnetic resonance) scan based on a cardiac synchronization technique with an appropriate region of an object to be imaged, said method comprising:

acquiring a pulsatile signal indicative of cardiac temporal phases of the object;

performing a plurality of times a preparatory MR scan with the region at each of different synchronizing time instants measured from a predetermined reference point repeatedly appearing in the pulsatile signal, wherein an MR signal is acquired by each scan;

producing a plurality of preparatory images, each assigned respectively to one of the corresponding plurality of different synchronizing time instants from the acquired MR signal; and using information about the plurality of preparatory images in the imaging MR scan.

28. The method of claim 27 wherein the information using step includes:

displaying the plurality of preparatory images, and manually selecting information about a synchronizing time instant for use in the imaging MR scan, the synchronizing time instant being for the cardiac synchronization technique and being determined by observing the plurality of preparatory images displayed.

29. The method of claim 27 wherein the information using step includes:

displaying the plurality of preparatory images, manually pointing to a desired position in each of the plurality of preparatory images, automatically calculating information about strengths of image data at the pointed position in each of the plurality of preparatory images, automatically selecting an appropriate one from the plurality of preparatory images on the basis of results calculated by the calculating step, and automatically using as the synchronizing time instant for the cardiac synchronization technique, the synchronizing time instant assigned to the selected preparatory image in the imaging MR scan.

30. A magnetic resonance imaging method comprising:

acquiring a pulsatile signal indicative of cardiac temporal phases of a patient;

performing a plurality of times a preparatory MR (magnetic resonance) scan with a region including an object to be imaged of the patient at each of different synchronizing time instants determined based on a predetermined reference point repeatedly appearing in the pulsatile signal, wherein MR signals are acquired by each scan;

producing a plurality of preparatory images using the acquired MR signals;

determining an appropriate synchronizing time instant for a cardiac synchronization technique on the basis of the plurality of preparatory images; and performing an imaging MR scan with the region of the patient in synchronization with the determined appropriate synchronization time instant.

31. The method of claim 30 wherein the pulsatile signal indicative of the cardiac temporal phases is an ECG (electrocardiogram) signal generated by the patient and the cardiac synchronization technique is an ECG-gating technique.

32. The method of claim 31 wherein the performing preparatory scans in step changes a delay time from an R-wave peak employed as the reference point, of the ECG signal into a plurality of delay times, and starts the preparatory MR scan at each of the synchronizing temporal instants when each of the changed delay times has elapsed.

33. The method of claim 32 wherein the object to be imaged includes one of (i) a tissue and (ii) blood vessel of the patient having a shorter spin-spin relaxation time of nuclear spins than at least some other patient structures giving off MR signals.

34. The method of claim 32 wherein both of the preparatory MR scans and the imaging MR scan are based on the same type of pulse sequences.

35. The method of claim 34 wherein the pulse sequence includes one of (i) a fast SE (spin echo) method and (ii) a method of the fast SE method type.

36. The method of claim 35 wherein the pulse sequence has a scan time of not less than approximately 200 msec per one time of RP excitation.

37. The method of claim 36 wherein:

the pulse sequence depends on a Fourier transform for reconstructing MR signals mapped in a frequency space into a real space image, the frequency space being divided into a plurality of blocks in a phase-encoding direction thereof.

38. The method of claim 34 wherein the pulse sequence comprises a segmented fast FE (gradient field echo) pulse sequence.

39. The method of claim 38 wherein the segmented fast FE pulse sequence has a pulse train to acquire a plurality of echo signals at each of a plurality of different time instants residing between R-waves and to map the echo signal acquired at the same time instant in each of a plurality of two-dimensional frequency spaces set to a single slice passing through the region of the patient.

40. The method of claim 34 wherein the pulse sequence comprises an EPI (echo planar imaging) pulse sequence.

41. The method of claim 34 wherein the pulse sequence used in the preparatory MR scan is for a two-dimensional scan and the pulse sequence used in the imaging MR scan is for a three-dimensional scan.

42. The method of claim 30 wherein:

the object comprises a plurality of types of objects;

the preparatory MR scan performing step performs the preparatory MR scan object-by-object in a phase-encoding direction in agreement with each of the plurality of types of objects;

the preparatory image producing step produces the plurality of preparatory images object-by-object from the MR signals acquired through the preparatory MR scan;

the appropriate synchronizing time instant determining step deter-mines the appropriate synchronizing time instant object-by-object on the basis of the plurality of preparatory images; and the imaging MR scan performing step performs the imaging MR scan object-by-object not only in synchronization with the appropriate synchronizing time instant determined for every object but also in a phase-encoding direction in agreement with a running direction of each of the plurality of objects.

43. The method of claim 42 wherein the plurality of types of objects comprises a plurality of types of blood vessels spatially running along different directions in the region.

44. The method of claim 43 wherein the imaging MR scan performing step:

acquires the echo signal object-by-object and produces image data associated with the region from the echo signal acquired for each object.

45. The method of claim 44 wherein the image data producing step:

reconstructs the echo signal into real space data object-by-object, and synthesizes the reconstructed data of each object pixel-by-pixel.

46. The method of claim 30 wherein:

the appropriate synchronizing time instant determining step represents the plurality of preparatory images to an operator interface as well as accepting a region of interest that the operator desires, and setting the appropriate synchronizing time instant using data associated with strength of the echo signal acquired from the region of interest.

47. The method of claim 46 wherein die appropriate synchronizing time instant determining step:

automatically uses the set appropriate synchronizing time instant in a sequence used in the imaging MR scan.

48. The method of claim 46 wherein:

the operator interface displays super-imposed information indicative of each of the plurality of different time instants on each of the plurality of preparatory images.

49. The method of claim 46 wherein:

the operator interface has a ROI (region ol interest) input used by the operator to input the region of interest with a ROI; and the setting step calculates a signal strength distribution from pixel values corresponding in position to the ROI and means for obtaining the appropriate synchronizing time instant from the signal strength distribution with a given algorithm.

50. The method of claim 30 wherein the preparatory MR scan performing step includes making a phase-encoding direction for the preparatory MR scan agree with a running direction of the object.

51. The method of claim 30 further comprising:

instructing the patient to execute a breath hold for a period during which the preparatory MR scan is performed.

* * * * *